(12) United States Patent
Yamazaki et al.

(10) Patent No.: US 9,240,425 B2
(45) Date of Patent: Jan. 19, 2016

(54) METHOD FOR MANUFACTURING LIGHT-EMITTING DISPLAY DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Jun Koyama, Kanagawa (JP); Kaoru Hatano, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/803,358

(22) Filed: Jul. 20, 2015

(65) Prior Publication Data

US 2015/0325595 A1 Nov. 12, 2015

Related U.S. Application Data

(62) Division of application No. 13/226,845, filed on Sep. 7, 2011.

(30) Foreign Application Priority Data

Sep. 10, 2010 (JP) ................................ 2010-202823

(51) Int. Cl.
*H01L 21/00* (2006.01)
*H01L 27/12* (2006.01)
(52) U.S. Cl.
CPC .......... *H01L 27/127* (2013.01); *H01L 27/1225* (2013.01); *H01L 27/1255* (2013.01)
(58) Field of Classification Search
CPC ... H01L 45/145; H01L 29/7869; H01L 21/00; H01L 21/02565; H01L 21/02554

USPC ......................................................... 438/104
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1624489 A 2/2006
EP 1737044 A 12/2006
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

(Continued)

*Primary Examiner* — Monica D Harrison
(74) *Attorney, Agent, or Firm* — Fish & Richardson P.C.

(57) ABSTRACT

It is an object of one embodiment of the present invention to manufacture a light-emitting display device by simplifying a manufacturing process of a transistor, without an increase in the number of steps as well as the number of photomasks as compared to those in the conventional case. A step for processing a semiconductor layer into an island shape is omitted by using a high-resistance oxide semiconductor which is intrinsic or substantially intrinsic for the semiconductor layer, used to form transistors. Formation of an opening in the semiconductor layer or an insulating layer formed over the semiconductor layer and etching of an unnecessary portion of the semiconductor layer are performed at the same time; thus, the number of photolithography steps is reduced.

12 Claims, 26 Drawing Sheets

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,279,714 | B2 | 10/2007 | Koo et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,696,562 | B2 | 4/2010 | Kawamata et al. |
| 7,732,819 | B2 | 6/2010 | Akimoto et al. |
| 8,067,775 | B2 | 11/2011 | Miyairi et al. |
| 8,278,162 | B2 * | 10/2012 | Akimoto ............ H01L 29/7869 257/E21.411 |
| 8,558,960 | B2 | 10/2013 | Yamazaki et al. |
| 8,647,919 | B2 | 2/2014 | Yamazaki et al. |
| 8,797,487 | B2 | 8/2014 | Koyama |
| 8,912,544 | B2 | 12/2014 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0043545 | A1 | 3/2004 | Yoo et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0146150 | A1 | 6/2009 | Hosoya |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0006844 | A1 | 1/2010 | Kim et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0134735 | A1 | 6/2010 | Nakamura et al. |
| 2011/0058116 | A1 | 3/2011 | Yamazaki et al. |
| 2014/0335653 | A1 | 11/2014 | Koyama |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-179069 A | 6/2003 |
| JP | 2004-103957 A | 4/2004 |
| JP | 2004-273614 A | 9/2004 |
| JP | 2004-273732 A | 9/2004 |
| JP | 2006-047999 A | 2/2006 |
| JP | 2010-153834 A | 7/2010 |
| WO | WO-2004/114391 | 12/2004 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08: Proceedings of the 15th International Display Workshops, Dec. 3, 2008, pp. 1673-1640.

Hayashi.R et al., "42.1: Invited Paper: Improved Amorphous In—Ga—Zn—O TFTS", SID Digest '08: SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02: Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Cho.D et al., "21.2:Al and Sn—Doped Zinc Indium Oxide Thin Film Transistors for AMOLED Back-Plane", SID Digest '09: SID International Symposium Digest of Technical Papers, May 31, 2009, pp. 280-283.

Lee.M et al., "15.4: Excellent Performance of Indium—Oxide—Based Thin-Film Transistors by DC Sputtering", SID Digest '09: SID International Symposium Digest of Technical Papers, May 31, 2009, pp. 191-193.

Jin.D et al., "65.2: Distinguished Paper: World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS", IDW '09: Proceedings of the 16th International Display Workshops, 2009, pp. 689-692.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper: Transparent Amorphous Oxide Semiconductors for High Performance TFT", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09: SID International Symposium Digest of Technical Papers, May 31, 2009, pp. 1110-1112.

Ohara.H et al., "21.3: 4.0 In. QVGA AMOLED Display Using In—Ga—Zn—Oxide TFTS With a Novel Passivation Layer", SID Digest '09: SID International Symposium Digest of Technical Papers, May 31, 2009, pp. 284-287.

Miyasaka.M, "Suftla Flexible Microelectronics on Their Way to Business", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper: Optically Isotropic Nano-Structured Liquid Crystal Composites for Display Applications", SID Digest '09: SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Lee.H et al., "Current Status of, Challenges to, and Perspective View of AM-OLED", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Applications", SID Digest '07: SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel, YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu, or Zn]at Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys, Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanes Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 122102-1-122102-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29: Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4): a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08: Proceedings of the 6th International Display Workshops, Dec. 3, 2008, pp. 581-584.

Kim.S et al., "High-Performance oxide thin film transistors passivated by various gas plasmas", 214th ECS Meetings, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

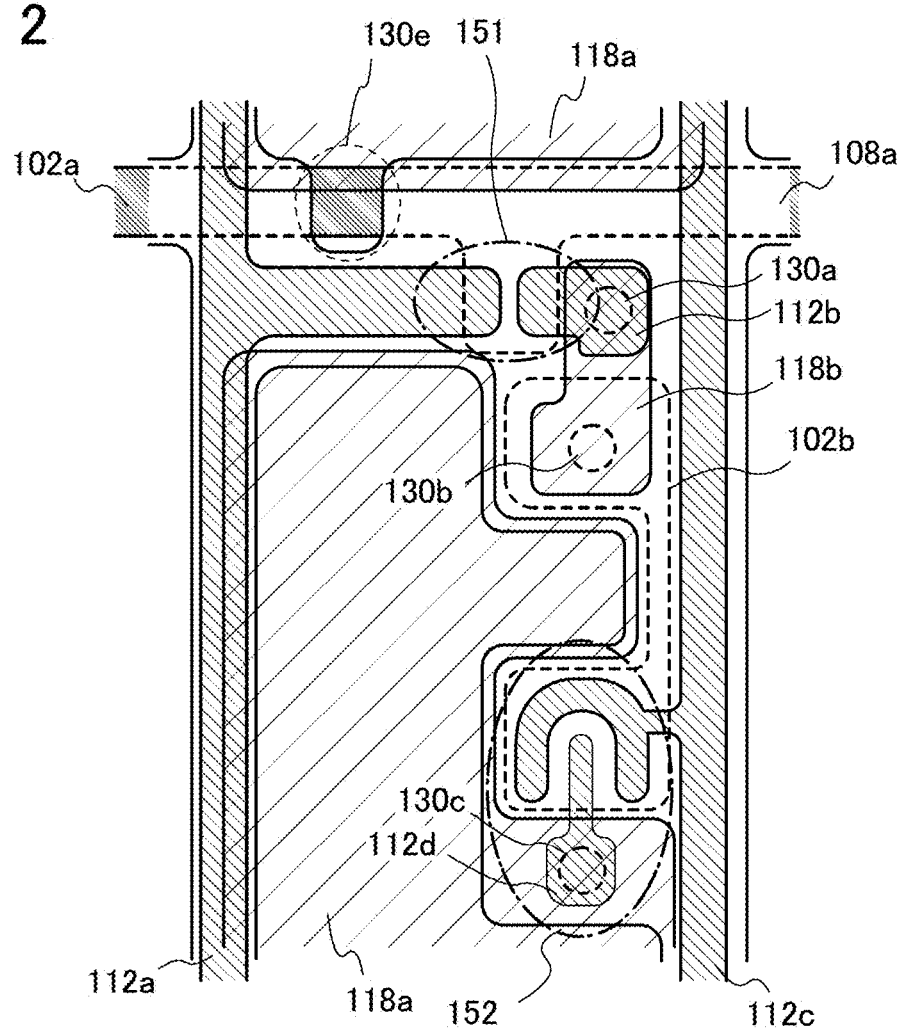

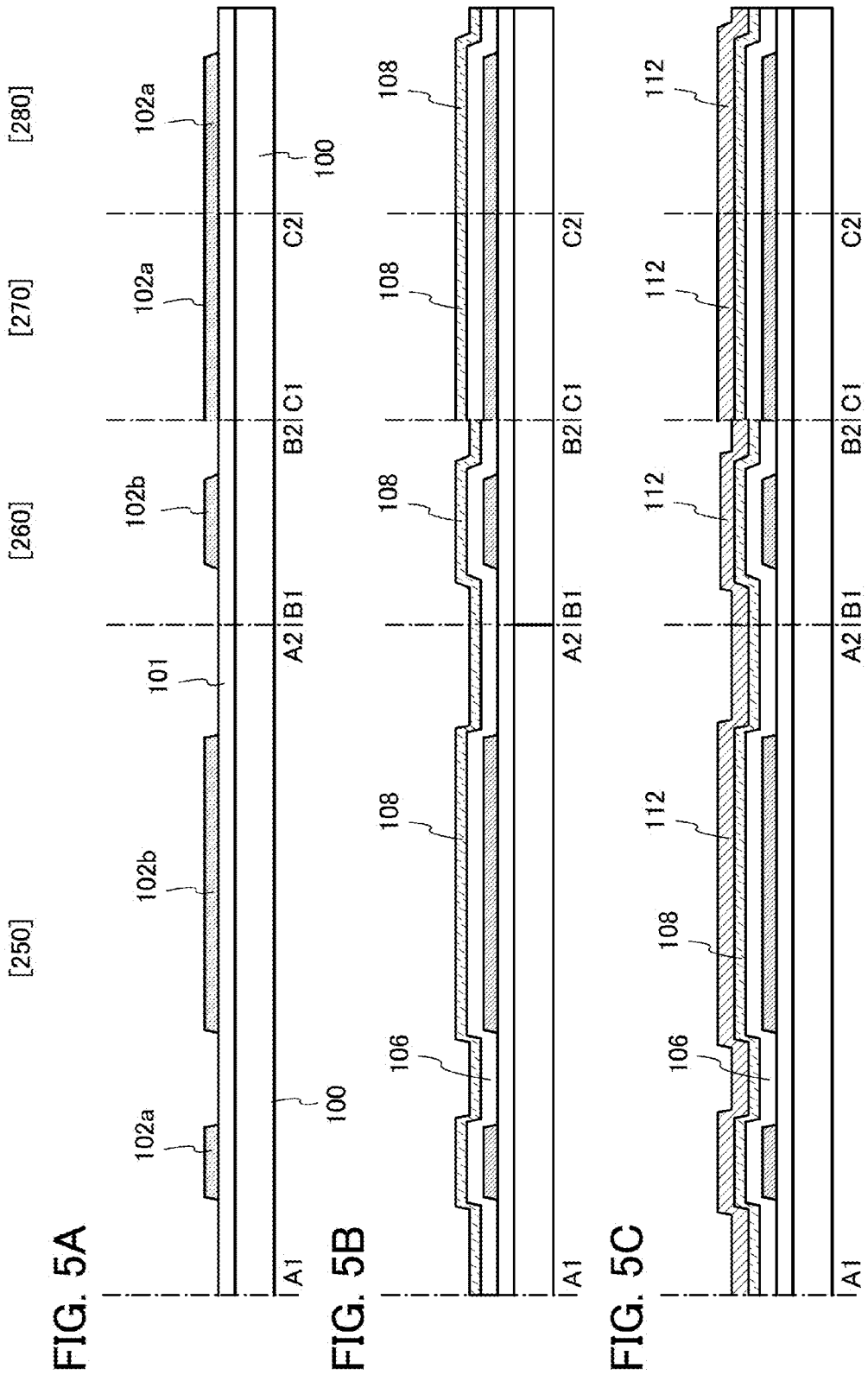

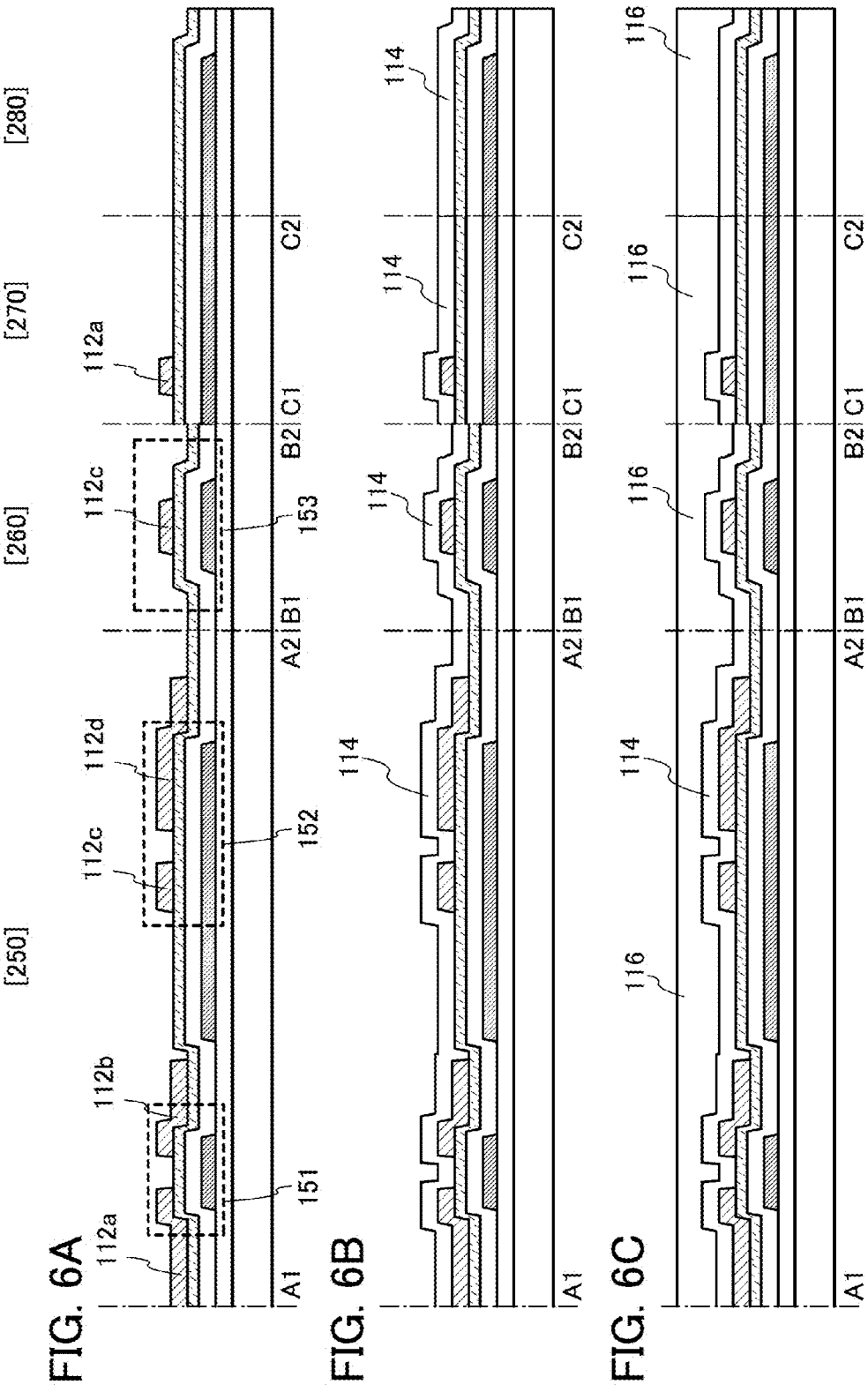

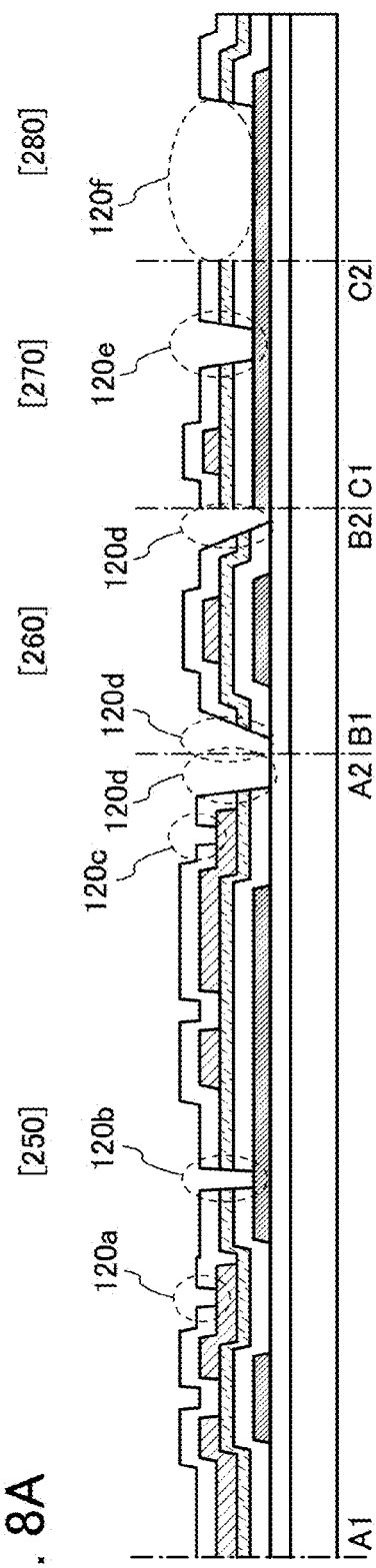
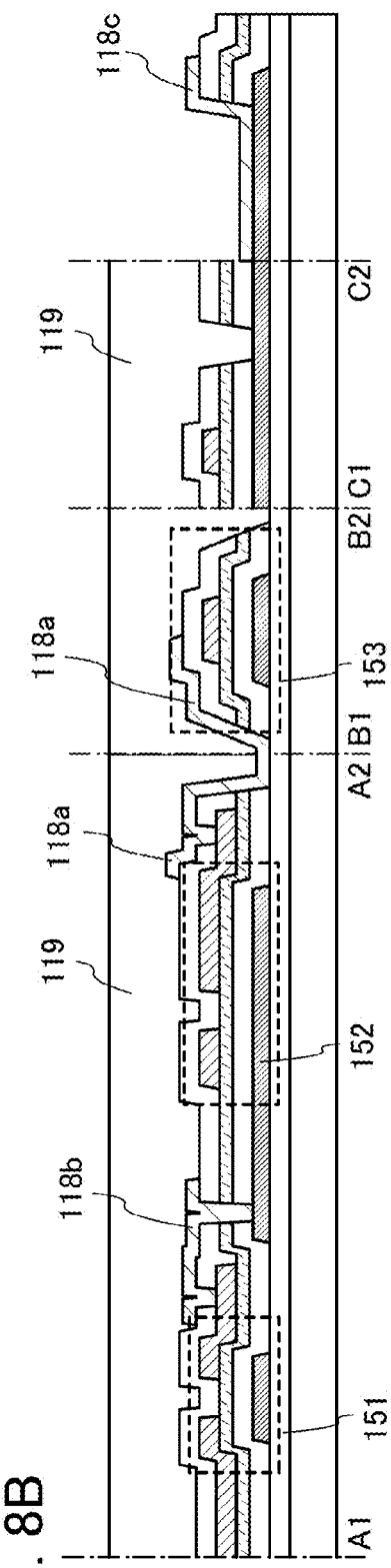
FIG. 8A
FIG. 8B

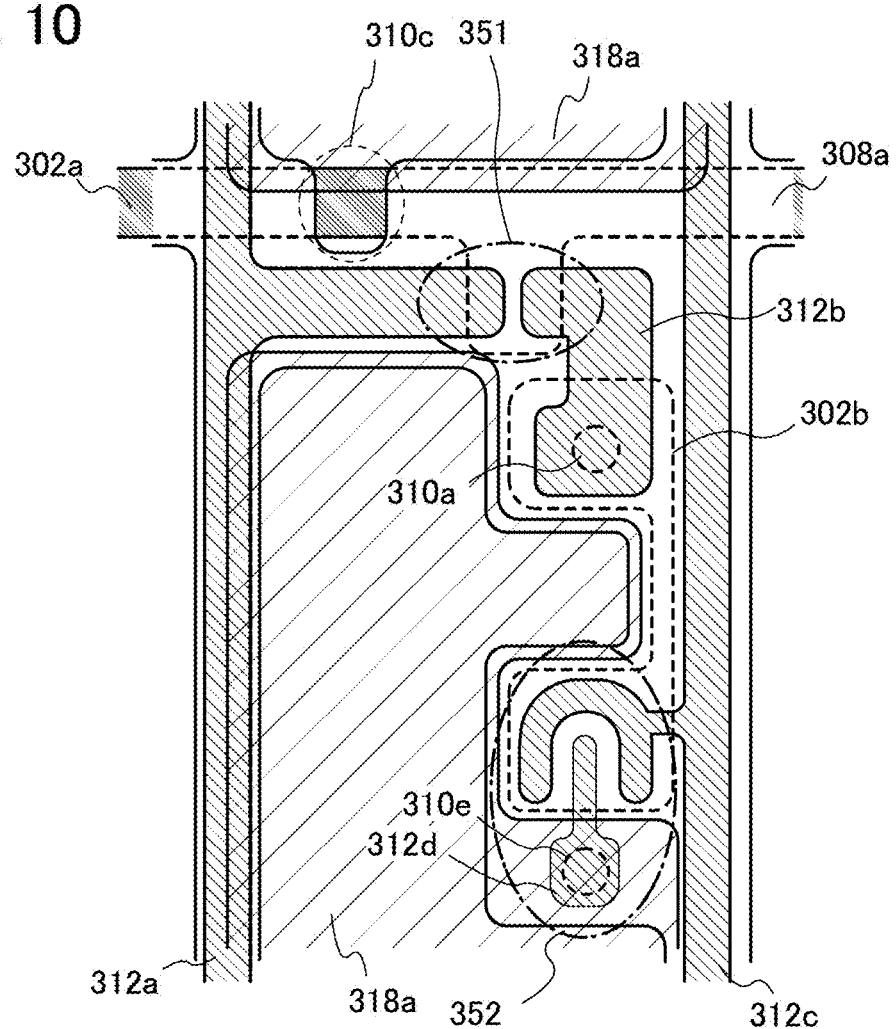

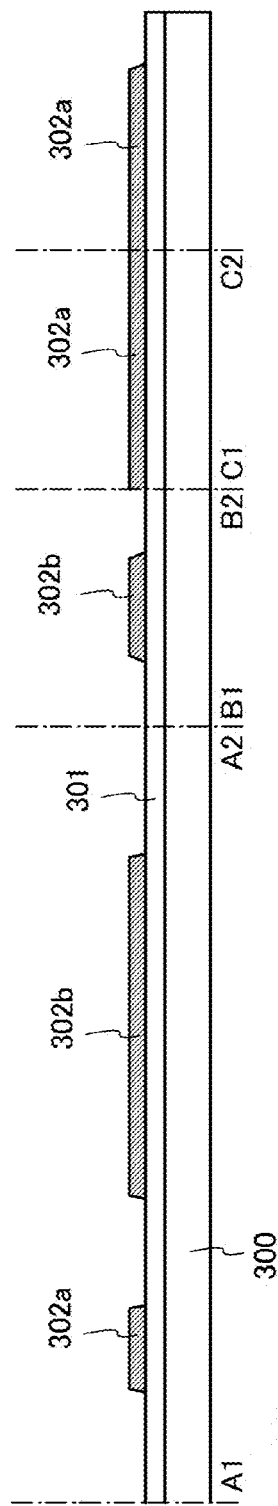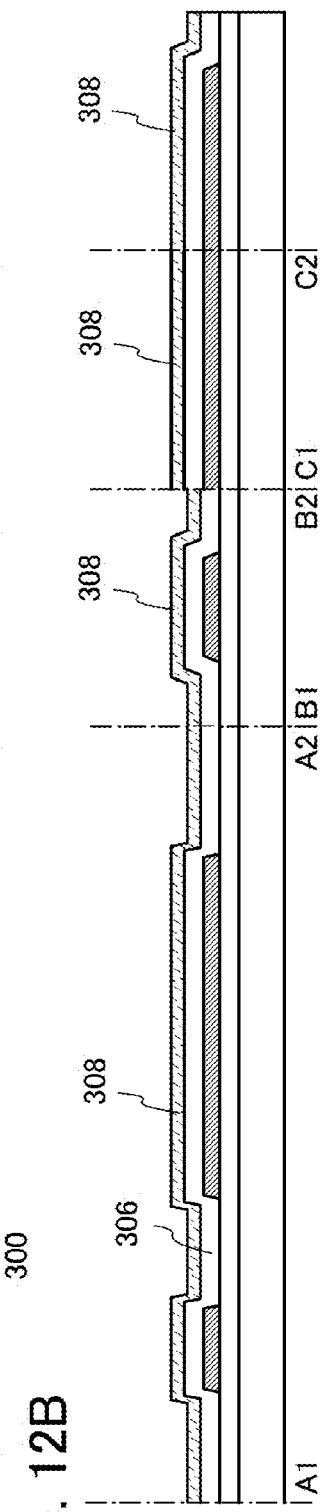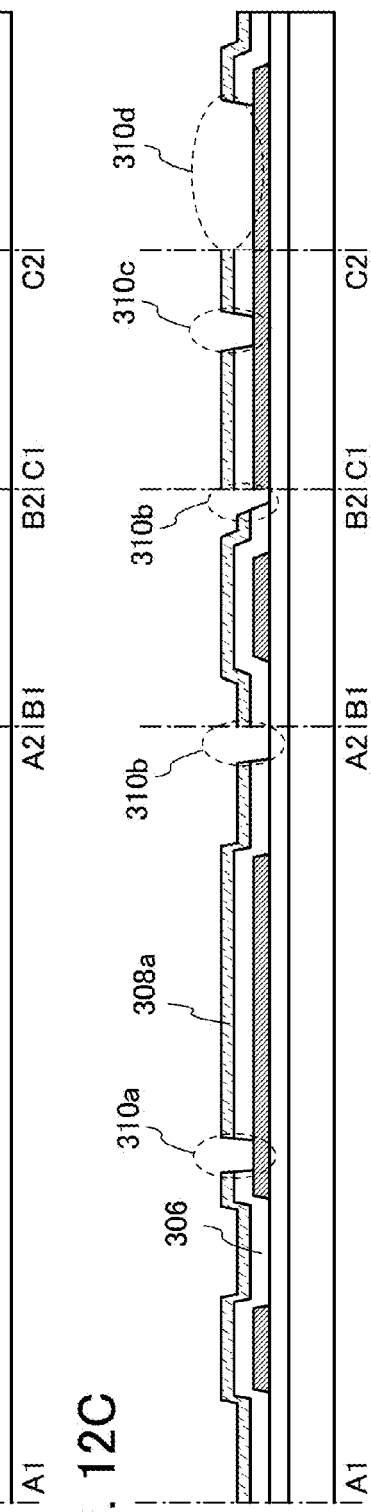

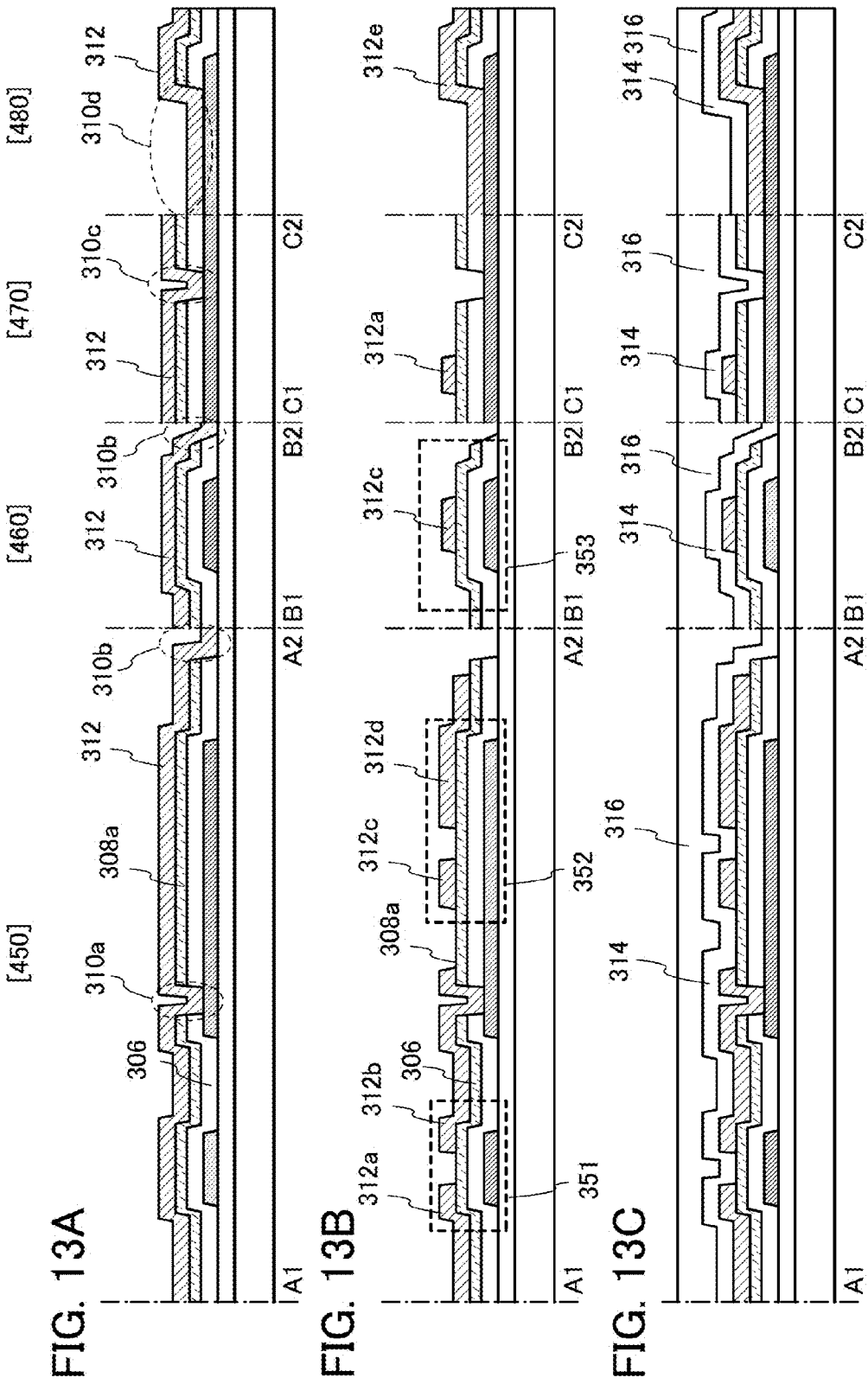

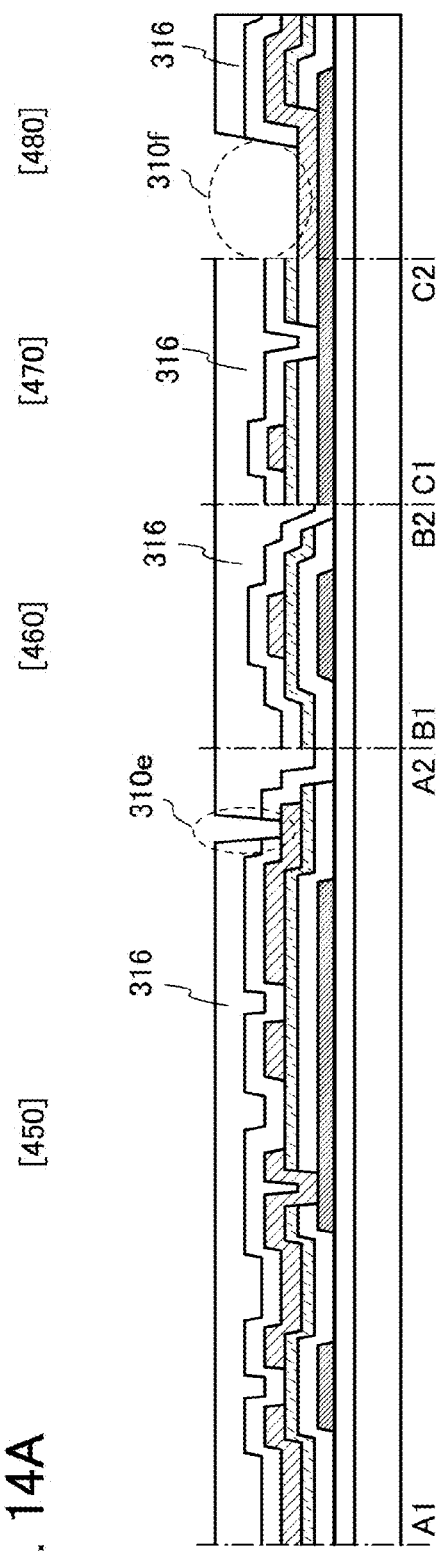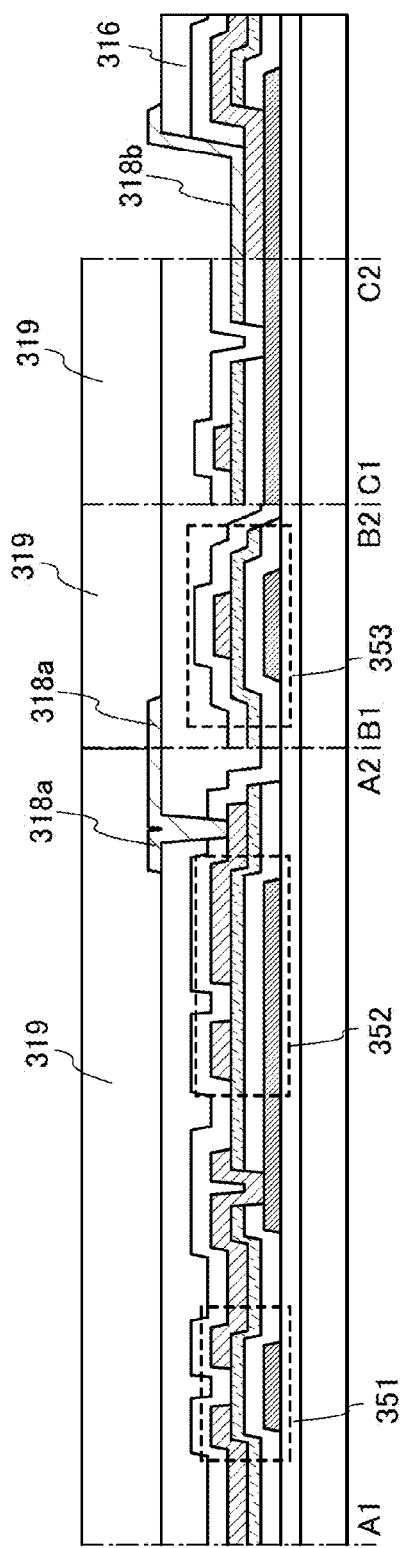

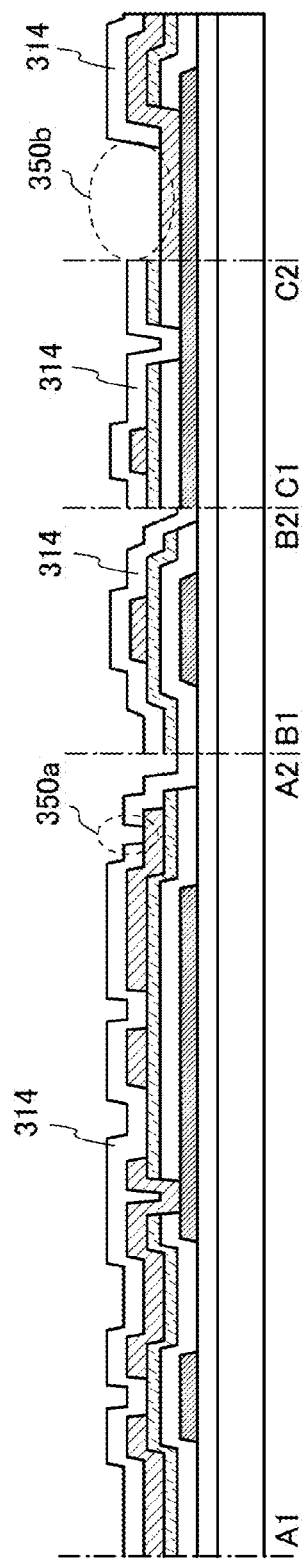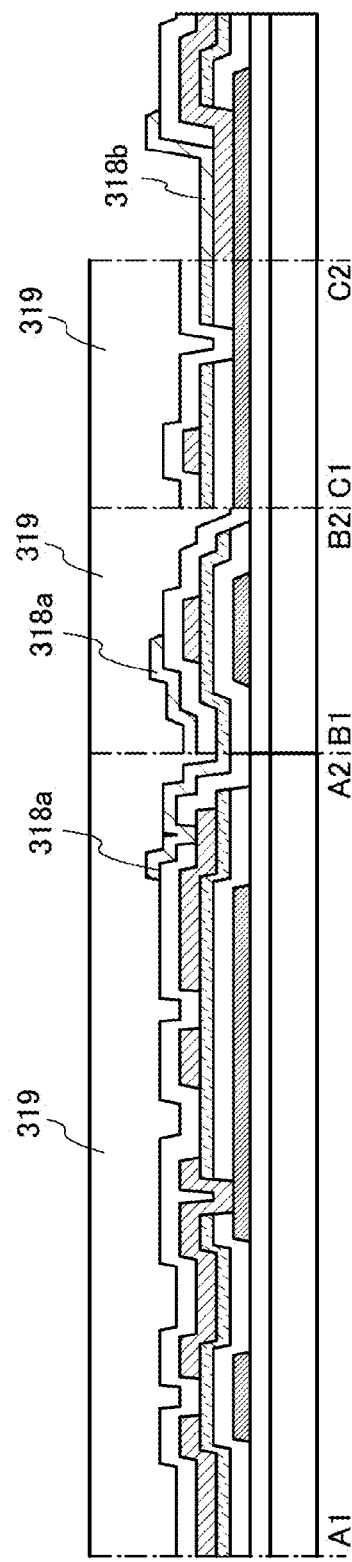

● In
○ Sn
· Zn
• O

FIG. 25B
FIG. 25A
FIG. 25C
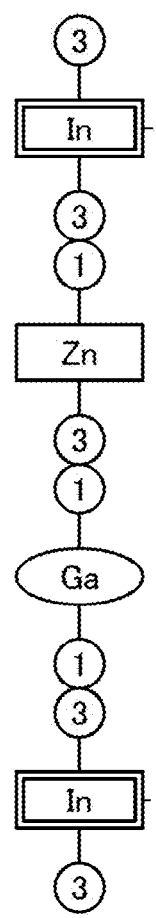
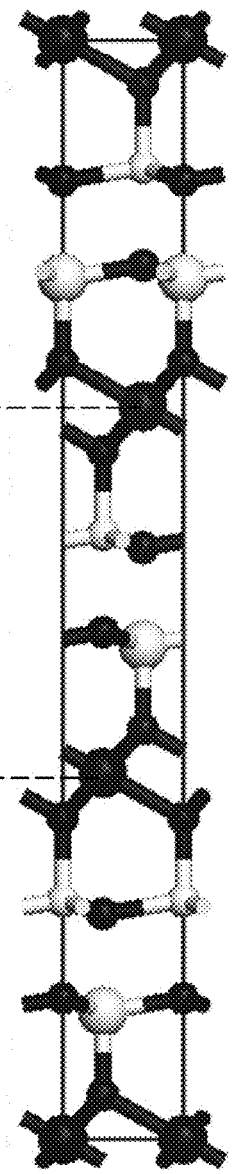
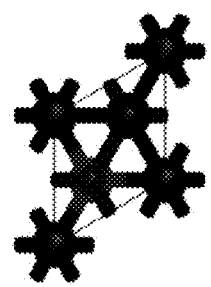
- In
- Ga
- Zn
- O

METHOD FOR MANUFACTURING LIGHT-EMITTING DISPLAY DEVICE

CROSS-REFERENCE TO RELATED APPLICATIONS

This application is a divisional of U.S. application Ser. No. 13/226,845, filed Sep. 7, 2011, now allowed, which claims the benefit of foreign a priority application filed in Japan as Serial No. 2010-202823 on Sep. 10, 2010, both of which are incorporated by reference.

BACKGROUND OF THE INVENTION

1. Field of the Invention

The present invention relates to methods for manufacturing a light-emitting display device including a transistor.

2. Description of the Related Art

In recent years, thin film transistors that are formed using a semiconductor thin film having a thickness of several nanometers to several hundreds of nanometers over a substrate having an insulating surface such as a glass substrate have been attracting attentions. Thin film transistors have been widely used for ICs (integrated circuits) and electronic devices typified by electrooptic devices. Thin film transistors have been rapidly developed particularly as switching elements for image display devices typified by EL (electroluminescence) display devices and the like.

In an active matrix EL display device, a voltage is applied between one electrode and another electrode which sandwich an EL layer (including a light-emitting layer), of a light-emitting element provided in a selected pixel, whereby a current is generated in the EL layer and the light-emitting layer emits light. A viewer perceives this light emission as a display pattern. In an active matrix EL display device, pixels arranged in a matrix are driven with switching elements, thereby forming a display pattern on a screen.

The application range of the active matrix EL display devices is expanding, and demands for larger screen size, higher definition, and higher aperture ratio are increasing. In addition, it is demanded that the active matrix display device have high reliability and that a production method of the active matrix display device offers high yield and reduces production cost. Simplification of a process is one way for increasing productivity and reducing manufacturing cost.

In an active matrix display device, switching elements are mainly constituted of thin film transistors. Thin film transistors are broadly classified into top gate thin film transistors, in which a channel formation region is provided below a gate electrode, and bottom gate thin film transistors, in which a channel formation region is provided above a gate electrode. These thin film transistors are generally manufactured using a plurality of photomasks.

In manufacture of thin film transistors, it is important that the number of photolithography steps be reduced or the photolithography steps be simplified in order to simplify a process as a whole. For example, when one photolithography step is added, the following steps are further needed: resist application, prebaking, light exposure, development, postbaking, and the like, and moreover other steps before and after the aforementioned steps, such as film formation and etching and further resist removal, cleaning, drying, and the like. Therefore, even when only one photolithography step is added in the manufacturing process, the number of steps relating to the photolithography step is significantly increased. Thus, many techniques for reducing the number of photolithography steps or simplifying the photolithography steps in the manufacturing process have been developed.

Further, as conventional techniques for simplifying the photolithography steps, complicated techniques such as backside light exposure, resist reflow, and lift off are often used and a particular apparatus is required in many cases. Using such complicated techniques may cause various problems, which leads to a decrease in yield. Furthermore, there has often been no option but to sacrifice electric characteristics of thin film transistors.

As typical means for simplifying the photolithography steps in the manufacturing process of a thin film transistor, a technique using a multi-tone mask (called a half-tone mask or a gray-tone mask) is widely known. As a technique for reducing the number of manufacturing steps by using a multi-tone mask, Patent Document 1 is disclosed, for example.

REFERENCE

[Patent Document 1] Japanese Published Patent Application No. 2003-179069

SUMMARY OF THE INVENTION

In the case where a multi-tone mask is used, although the number of masks can be reduced, an additional step such as ashing is necessary in order to process a resist mask into a different shape.

It is an object of one embodiment of the present invention to manufacture a light-emitting display device without an increase in the number of steps as well as the number of photomasks as compared to those in the conventional case.

One embodiment of the present invention disclosed in this specification relates to a method for manufacturing a light-emitting display device, in which a step for processing a semiconductor layer into an island shape in each transistor is omitted to reduce the number of photolithography steps by using a high-resistance oxide semiconductor for the semiconductor layer which forms each transistor.

One embodiment of the present invention disclosed in this specification is a method for manufacturing a light-emitting display device, in which a first conductive film is formed over a substrate having an insulating surface; a first resist mask is formed over the first conductive film; a first gate electrode and a second gate electrode are formed by selectively etching the first conductive film with the first resist mask; a first insulating film that serves as a gate insulating layer is formed over the first gate electrode and the second gate electrode; a semiconductor film is formed over the first insulating film; heat treatment is performed on the semiconductor film; a second conductive film is formed over the semiconductor film on which the heat treatment has been performed; a second resist mask is formed over the second conductive film; one of first source and drain electrodes which is electrically connected to a source or drain wiring, the other of the first source and drain electrodes, one of second source and drain electrodes which is electrically connected to a power supply wiring, and the other of the second source and drain electrodes are formed by selectively etching the second conductive film with the second resist mask and thus a first transistor including the first gate electrode and the first source and drain electrodes and a second transistor including the second gate electrode and the second source and drain electrodes are formed; a second insulating film that serves as a protective insulating film is formed over the first source and drain electrodes, the second source and drain electrodes, and the semiconductor film; a planarization insulating film and a third insulating film that serves as a resist mask is formed over the second insulating film; a first opening which exposes part of the other of the first source and drain electrodes and a third opening which exposes part of the other of the second source and drain electrodes are formed by selectively etching the second insulating film with the third insulating film as a third resist mask, and a second opening which exposes part of the second gate electrode and a fourth opening which exposes part of the substrate having an insulating surface are formed by selectively etching the second insulating film, the semiconductor film, and the first insulating film; a third conductive film is formed over the third insulating film so as to cover the first opening, the second opening, the third opening, and the fourth opening; a fourth resist mask is formed over the third conductive film; a first pixel electrode and a connection electrode with which the other of the first source and the drain electrodes and the second gate electrode are electrically connected to each other are formed by selectively etching the third conductive film with the fourth resist mask; a fourth insulating film is formed so as to cover the peripheries of the first opening, the second opening, the third opening, and the first pixel electrode; a layer containing an organic compound is selectively formed over the first pixel electrode; and a second pixel electrode is selectively formed over the layer containing an organic compound.

Note that in this specification and the like, ordinal numbers such as "first", "second", and "third" are used in order to avoid confusion among components, and the terms do not limit the components numerically.

Another embodiment of the present invention disclosed in this specification is a method for manufacturing a light-emitting display device, in which a first conductive film is formed over a substrate having an insulating surface; a first resist mask is forming over the first conductive film; a first gate electrode and a second gate electrode are formed by selectively etching the first conductive film with the first resist mask; a first insulating film that serves as a gate insulating layer is formed over the first gate electrode and the second gate electrode; a semiconductor film is formed over the first insulating film; heat treatment is performed on the semiconductor film; a second resist mask is formed over the semiconductor film on which the heat treatment is performed; a first opening which exposes part of the second gate electrode and a second opening which exposes part of the substrate having an insulating surface are formed by selectively etching part of the semiconductor film and the first insulating film which are formed over the second gate electrode, with the second resist mask; a second conductive film is formed so as to cover the semiconductor film, the first opening, and the second opening; a third resist mask is formed over the second conductive film; one of first source and drain electrodes which is electrically connected to a source or drain wiring and the other of the first source and drain electrodes which is electrically connected to the second gate electrode, and one of second source and drain electrodes which is electrically connected to a power supply wiring and the other of the second source and drain electrodes are formed by selectively etching the second conductive film with the third resist mask and thus a first transistor including the first gate electrode and the first source and drain electrodes and a second transistor including the second gate electrode and the second source and drain electrodes are formed; a second insulating film that serves as a protective insulating film is formed over the first source and drain electrodes, the second source and drain electrodes, and the semiconductor film; a planarization insulating film and a third insulating film that serves as a resist mask is formed over the second insulating film; a third opening which exposes part of the other of the second source and drain electrodes is formed by selectively etching the second insulating film with the third insulating film as a third resist mask; a third conductive film is formed over the third insulating film so as to cover the third opening; a fourth resist mask is formed over the third conductive film; a first pixel electrode is formed by selectively etching the third conductive film with the fourth resist mask; a fourth insulating film is formed so as to cover the peripheries of the third opening and the first pixel electrode; a layer containing an organic compound is selectively formed over the first pixel electrode; and a second pixel electrode is selectively formed over the layer containing an organic compound.

An oxide semiconductor is preferably used for the semiconductor film. An i-type or substantially i-type oxide semiconductor has extremely high resistance and therefore can be regarded as an insulator when designing a circuit. Thus, even when a plurality of transistors is formed with the same island-shaped semiconductor layer, the transistors can operate without interfering with each other.

Since an oxide semiconductor can be regarded as an insulator, a method for manufacturing a light-emitting display device, in which a step of forming an island-shaped semiconductor layer in each transistor can be omitted to reduce the number of photolithography steps, can be provided.

BRIEF DESCRIPTION OF THE DRAWINGS

FIG. 2 is a plan view illustrating a light-emitting display device without a capacitor.

FIGS. 5A to 5C are cross-sectional views illustrating one embodiment of a method for manufacturing a light-emitting display device.

FIGS. 6A to 6C are cross-sectional views illustrating one embodiment of a method for manufacturing a light-emitting display device.

FIGS. 8A and 8B are cross-sectional views illustrating one embodiment of a method for manufacturing a light-emitting display device.

FIG. 10 is a plan view illustrating a light-emitting display device without a capacitor.

FIGS. 12A to 12C are cross-sectional views illustrating one embodiment of a method for manufacturing a light-emitting display device.

FIGS. 13A to 13C are cross-sectional views illustrating one embodiment of a method for manufacturing a light-emitting display device.

FIGS. 14A and 14B are cross-sectional views illustrating one embodiment of a method for manufacturing a light-emitting display device.

FIGS. 15A and 15B are cross-sectional views illustrating one embodiment of a method for manufacturing a light-emitting display device.

FIGS. 25A to 25C illustrate a structure of an oxide material.

DETAILED DESCRIPTION OF THE INVENTION

Figure 1A:
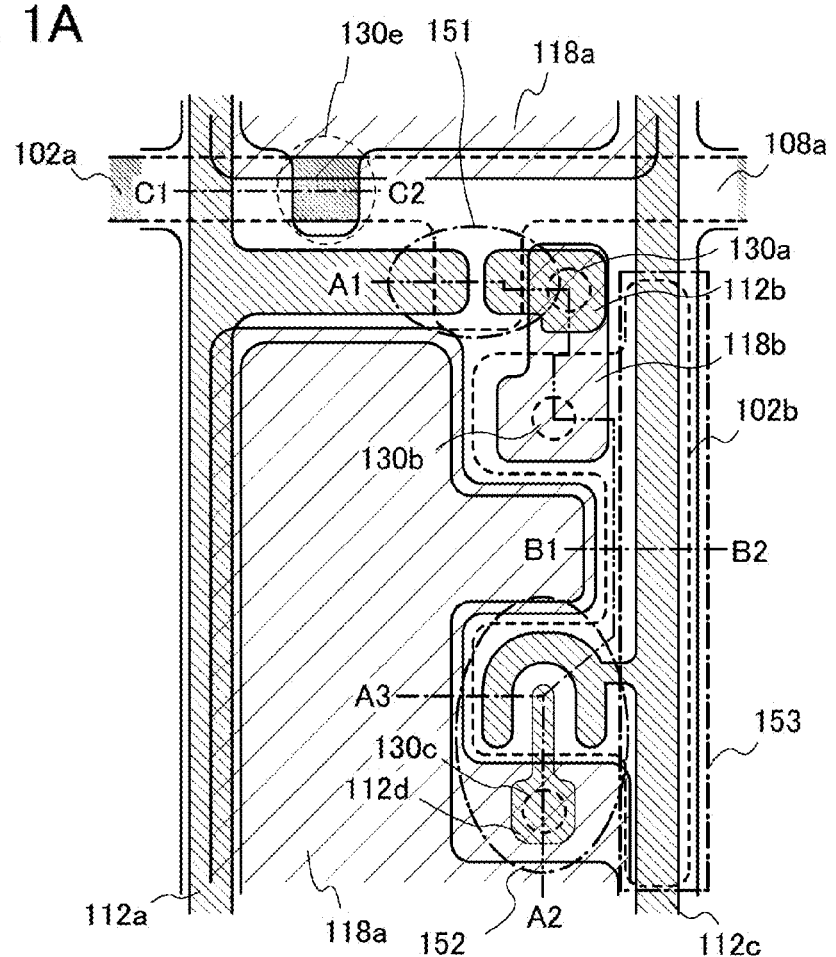
FIG. 1A is a plan view and FIG. 1B is a cross-sectional view illustrating one embodiment of a light-emitting display device.

Embodiments of the present invention will be described below in detail with reference to the accompanying drawings. However, the present invention is not limited to the description below and it is easily understood by those skilled in the art that the mode and details can be changed variously. Therefore, the present invention is not construed as being limited to description of the embodiments. In describing structures of the present invention with reference to the drawings, the same reference numerals are used in common for the same portions in different drawings. The same hatching pattern is applied to similar parts, and the similar parts are not especially denoted by reference numerals in some cases.

Embodiment 1

In this embodiment, one example of a structure of a pixel portion included in a light-emitting display device in one embodiment of the present invention will be described.

Figure 1B:
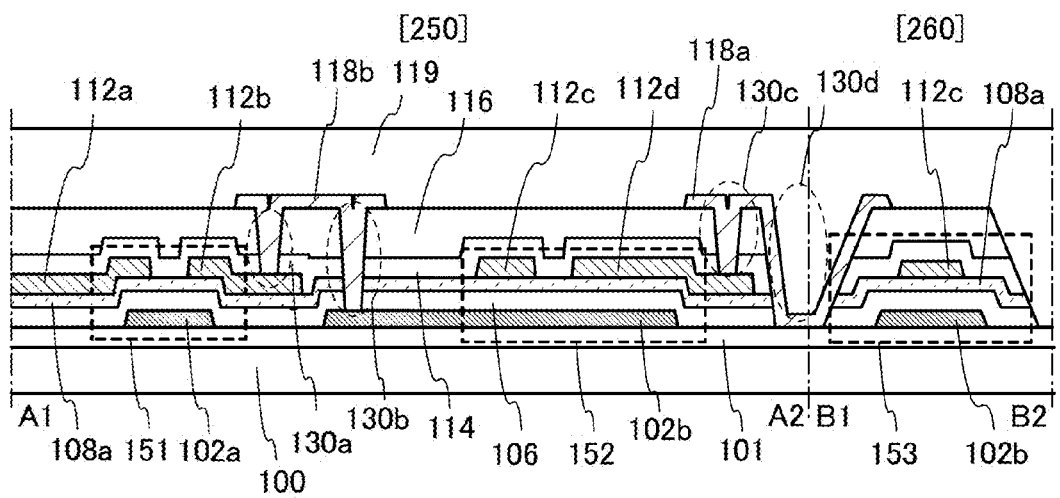
Figure 3A:
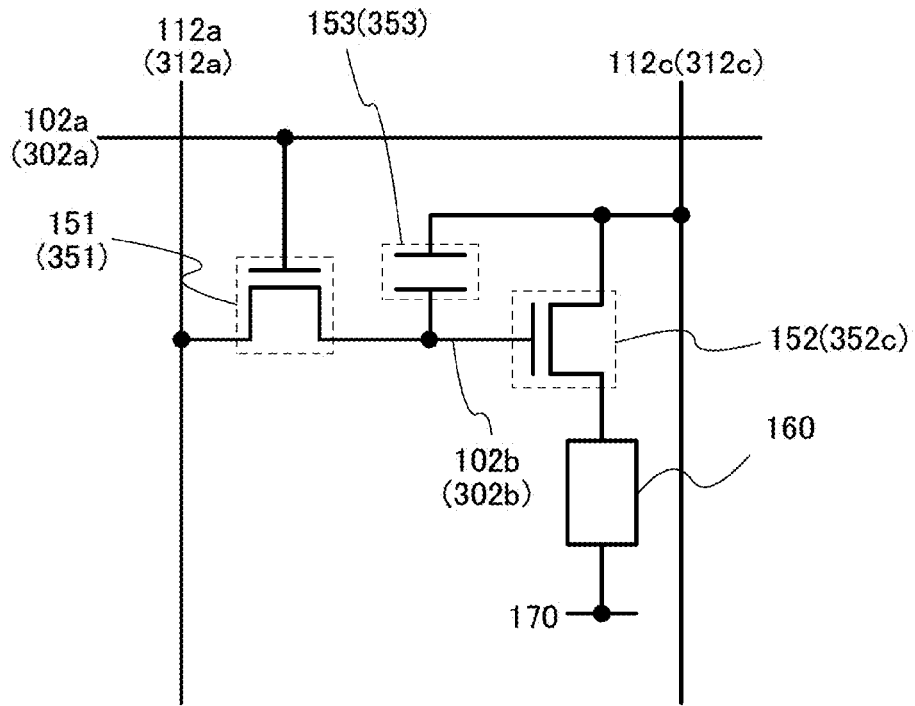
FIGS. 3A and 3B are each an equivalent circuit diagram of a pixel portion in a light-emitting display device.

FIGS. 1A and 1B show an example of a pixel portion of an active matrix light-emitting display device to which one embodiment of the present invention is applied. FIG. 1A is a plan view of the pixel portion of the light-emitting display device, and FIG. 1B is a cross-sectional view taken along lines A1-A2 and B1-B2 of FIG. 1A. FIG. 3A is an equivalent circuit in the pixel portion of the active matrix light-emitting display device illustrated in FIGS. 1A and 1B. Note that an EL layer 160 and a second pixel electrode layer (common electrode) 170 which are illustrated in FIG. 3A are not illustrated in FIGS. 1A and 1B.

Note that in this specification, an "EL layer" refers to a layer provided between a pair of electrodes in a light-emitting element. Accordingly, a layer including an organic compound which is a light-emitting substance, which is provided between a pair of electrodes, is one embodiment of an EL layer.

In this embodiment, a structure of the pixel portion in the light-emitting display device and a manufacturing method thereof will be described. Note that a transistor in this embodiment refers to one or both a first transistor 151 and a second transistor 152 illustrated in FIGS. 1A and 1B. These transistors are each an n-channel transistor including an oxide semiconductor to be described subsequently.

The pixel portion of the active matrix light-emitting display device illustrated in FIGS. 1A and 1B includes, over a substrate 100 having an insulating surface, the first transistor 151 including a first gate electrode layer 102a, a gate insulating layer 106, a semiconductor layer 108a, one of a first source electrode layer and a first drain electrode layer 112a and the other of the first source electrode layer and the first drain electrode layer 112b; and the second transistor 152 including a second gate electrode layer 102b, the gate insulating layer 106, the semiconductor layer 108a, and one of a second source electrode layer and a second drain electrode layer 112c and the other of the second source electrode layer and the second drain electrode layer 112d.

Note that the substrate having an insulating surface is not limited to a substrate formed using an insulating material. A substrate provided with an insulating film thereover regardless of the material of the substrate can be used. In the structure of FIGS. 1A and 1B, an example in which a base film 101 is formed over the substrate 100 as an insulating film is shown. As long as the substrate 100 is formed using an insulating material, the base film 101 can be omitted.

The first gate electrode layer 102a is connected to a gate wiring, the one of the first source electrode layer and the first drain electrode layer 112a is connected to a source or drain wiring, the other of the first source electrode layer and the first drain electrode layer 112b is connected to the second gate electrode layer 102b by a connection electrode layer 118b which is formed so as to cover a first opening 130a and a second opening 130b, the one of the second source electrode layer and the second drain electrode layer 112c is connected to a power supply wiring, and the other of the second source electrode layer and the second drain electrode layer 112d is connected to a first pixel electrode layer 118a in a third opening 130c. Note that in FIG. 1A, pairs of the gate wiring and the first gate electrode layer, the source or drain wiring and the one of the first source electrode layer and the first drain electrode layer, and the power supply wiring and the one of the second source electrode layer and the second drain electrode layer are respectively formed as one object and denoted by same reference numerals.

Note that although the first transistor 151 illustrated in FIGS. 1A and 1B has a single-gate structure, a multi-gate structure may be employed. A multi-gate transistor has small off-current, and a light-emitting display device including the transistor can have improved display characteristics.

Further, the second gate electrode layer 102b and the power supply wiring (the one of the second source electrode layer and the second drain electrode layer 112c) have an overlapping region with the gate insulating layer 106 and the semiconductor layer 108a interposed therebetween, whereby a capacitor 153 is formed. When dielectric layers are formed to have a multi-layer structure in such a manner, even in the case where a pinhole is generated in one dielectric layer, the pinhole can be covered with another dielectric layer; therefore, the capacitor 153 can function normally. Further, the relative permittivity of an oxide semiconductor is as high as 14 to 16; therefore, the capacitance of the capacitor 153 can be increased when an oxide semiconductor is used for the semiconductor layer 108a.

A protective insulating layer 114 and a planarization insulating layer 116 are formed over the first transistor 151 and the second transistor 152, and the following openings are formed by removing parts of the protective insulating layer 114 and of the planarization insulating layer 116: the first opening 130a which reaches the other of the first source electrode layer and the first drain electrode layer 112b; the second opening 130b which reaches the second gate electrode layer 102b; the third opening 130c which reaches the other of the second source electrode layer and the second drain electrode layer 112d; and a fourth opening 130d which reaches the base film 101. Further, the planarization insulating layer 116 may be omitted.

Further, a fifth opening 130e illustrated in FIG. 1A is formed so as to form a separation region in the semiconductor layer 108a and the gate insulating layer 106 which are provided over the gate wiring (the first gate electrode layer 102a). With the fifth opening 130e, the adverse effect of a parasitic transistor including the gate wiring (the first gate electrode layer 102a), the gate insulating layer 106, the semiconductor layer 108a, the source or drain wiring (the one of the first source electrode layer and the first drain electrode layer 112a), and the power supply wiring (the one of the second source electrode layer and the second drain electrode layer 112c) can be eliminated.

Furthermore, a partition wall 119, which is not illustrated in FIG. 1A, is formed so as to cover the end portions of the first pixel electrode layer 118a, an unevenness region in the above structure, and the like. With the partition wall 119, disconnection of the EL layer and the second pixel electrode layer to be subsequently formed over the first pixel electrode layer 118a and the like can be prevented.

Figure 3B:
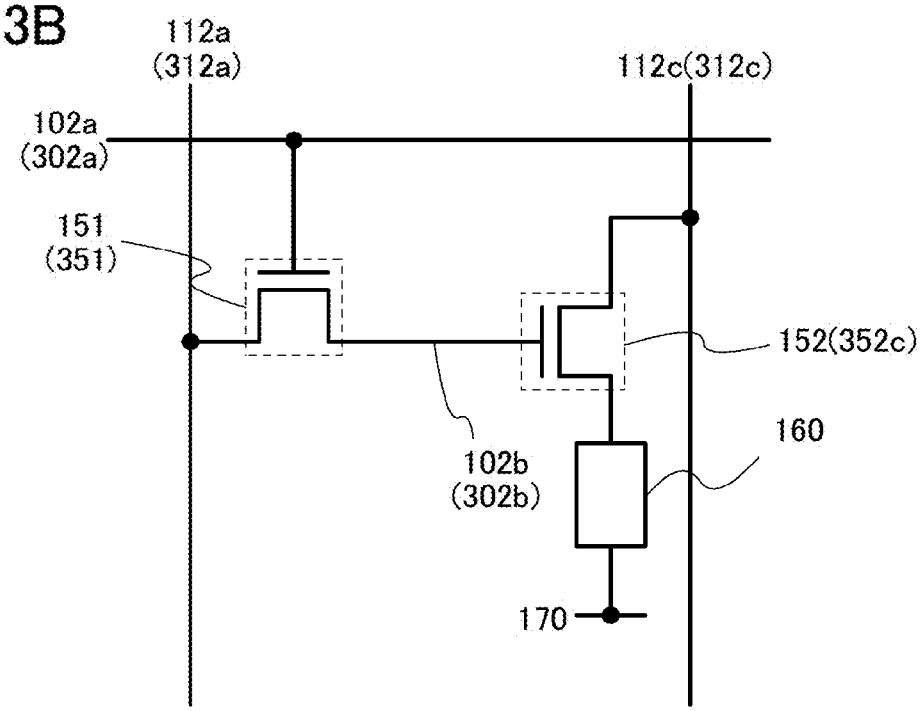

Note that a capacitor is not necessarily provided as illustrated in FIG. 2. In FIG. 2, the second gate electrode layer 102b does not overlap with the power supply wiring (the one of the second source electrode layer and the second drain electrode layer 112c); thus, a capacitor is not formed. An equivalent circuit of this structure is illustrated in FIG. 3B.

As a material for the semiconductor layer 108a, an oxide semiconductor is preferably used. For the oxide semiconductor layer, a thin film using a material represented by the chemical formula, InMO$_3$(ZnO)$_m$ (m>0), can be used. Here, M represents one or more metal elements selected from Sn, Zn, Ga, Al, Mn, and Co. For example, M can be Ga, Ga and Al, Ga and Mn, Ga and Co, or the like.

For example, an In—Ga—Zn—O-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn—O-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions is preferably used.

However, the composition is not limited to those described above, and a material having the appropriate composition may be used depending on needed semiconductor characteristics (e.g., mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

For example, high mobility can be obtained relatively easily in the case where the In—Sn—Zn—O-based oxide is used. However, the mobility can be increased by reducing the defect density in the bulk also in the case where the In—Ga—Zn—O-based oxide is used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2$ and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In a crystalline oxide semiconductor, when defects in the bulk can be further reduced and when surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, or more preferably less than or equal to 0.1 nm.

Note that the average surface roughness (Ra) is obtained by expanding, into three dimensions, center line average roughness that is defined by JIS B 0601 so as to be able to apply it to a measurement surface. The Ra can be expressed as an "average value of the absolute values of deviations from a reference surface to a designated surface" and is defined by the following formula.

$$Ra = \frac{1}{S_0}\int_{y_1}^{y_2}\int_{x_1}^{x_2}|f(x, y) - Z_0|dxdy \qquad \text{[FORMULA 1]}$$

In the above formula, $S_0$ represents the area of a measurement surface (a rectangular region which is defined by four points represented by coordinates $(x_1, y_1)$, $(x_1, y_2)$, $(x_2, y_1)$, and $(x_2, y_2)$), and Zo represents an average height of the measurement surface. Ra can be measured using an atomic force microscope (AFM).

The transistor formed using an oxide semiconductor for the semiconductor layer 108a has electric characteristics exhibiting extremely low off-state current. The oxide semiconductor is preferably purified by sufficient removal of impurities such as hydrogen or sufficient supply of oxygen. Specifically, the concentration of hydrogen in the oxide semiconductor is lower than or equal to $5\times10^{19}$ atoms/cm$^3$, preferably lower than or equal to $5\times10^{18}$ atoms/cm$^3$, or more preferably lower than or equal to $5\times10^{17}$ atoms/cm$^3$, for example. Note that the concentration of hydrogen in the oxide semiconductor is measured by secondary ion mass spectrometry (SIMS). As described above, hydrogen is reduced to a sufficiently low concentration so that the oxide semiconductor is purified, and oxygen is sufficiently supplied, whereby the density of carriers generated due to a donor such as hydrogen in the oxide semiconductor in which defect levels in an energy gap due to oxygen deficiency are reduced is less than $1\times10^{12}$/cm$^3$, preferably less than $1\times10^{11}$/cm$^3$, or more preferably less than $1.45\times10^{10}$/cm$^3$. In addition, for example, the off-state current (here per unit channel width (1 μm)) at room temperature (25° C.) is less than or equal to 100 zA (1 zA (zeptoampere) is $1\times10^{-21}$ A) or preferably less than or equal to 10 zA. In this manner, by using an i-type (intrinsic) or substantially i-type oxide semiconductor, the transistor having excellent off-state current characteristics can be obtained.

Characteristics of holding electric charges held in a pixel are extremely excellent; thus, in the case where a capacitor is not provided or the area of a storage capacitor becomes smaller than that in the structure illustrated in FIGS. 1A and 1B, an image can be held without any problem with a frame frequency of 60 Hz, which is general, or less than 60 Hz.

Note that it has been pointed out that an oxide semiconductor is insensitive to impurities, that there is no problem when a considerable amount of metal impurities is contained in the film, and therefore soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). But as explained below, such consideration may be erroneous. The minimum amount of alkali metals contained in an oxide semiconductor when measured using secondary ion mass spectrometry is as follows: sodium (Na) is at less than or equal to $5 \times 10^{16}$ cm$^{-3}$, preferably less than or equal to $1 \times 10^{16}$ cm$^{-3}$, or more preferably less than or equal to $1 \times 10^{15}$ cm$^{-3}$; lithium (Li) is at less than or equal to $5 \times 10^{15}$ cm$^3$, preferably less than or equal to $1 \times 10^{15}$ cm$^{-3}$; and potassium (K) is less than or equal to $5 \times 10^{15}$ cm$^{-3}$, preferably less than or equal to $1 \times 10^{15}$ cm$^3$ An alkali metal and an alkaline earth metal are adverse impurities for the oxide semiconductor and are preferably contained as little as possible. An alkali metal, in particular, Na diffuses into an oxide and becomes Na when an insulating film which is formed in contact with the oxide semiconductor is an oxide. In addition, Na cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the concentration of hydrogen in the oxide semiconductor is extremely low. Therefore, the concentration of an alkali metal is strongly required to set to the above value in the case where the concentration of hydrogen in the oxide semiconductor is lower than or equal to $5 \times 10^{19}$ cm$^{-3}$, particularly lower than or equal to $5 \times 10^{18}$ cm$^{-3}$.

The i-type or substantially i-type oxide semiconductor has extremely high resistance and therefore can be regarded as an insulator when designing a circuit. Thus, even when a plurality of transistor is formed with the same island-shaped semiconductor layer, the transistors can operate without interfering with each other.

In addition, in the structure of FIG. 1B, there is a region where the first pixel electrode layer 118a is in contact with the side surface of the semiconductor layer 108a; however, a problem of leakage current or the like does not occur even when the first pixel electrode layer 118a and the end portion of the semiconductor layer 108a are in contact with each other because the i-type or substantially i-type oxide semiconductor can be regarded as an insulator as explained above.

Figure 4A:
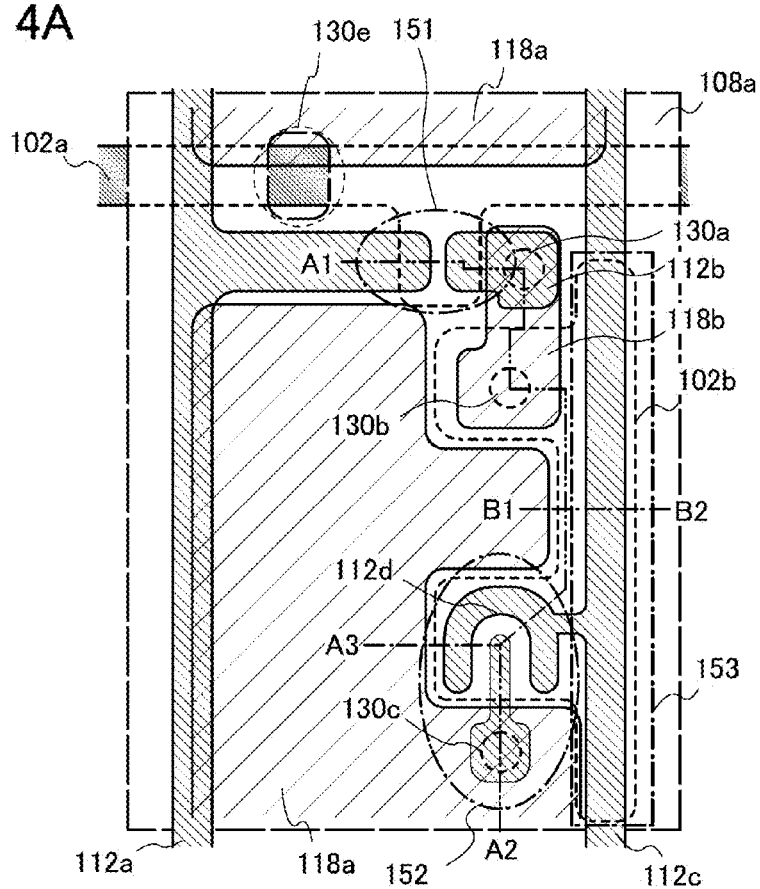
FIG. 4A is a plan view and FIG. 4B is a cross-sectional view illustrating one embodiment of a light-emitting display device.
Figure 4B:
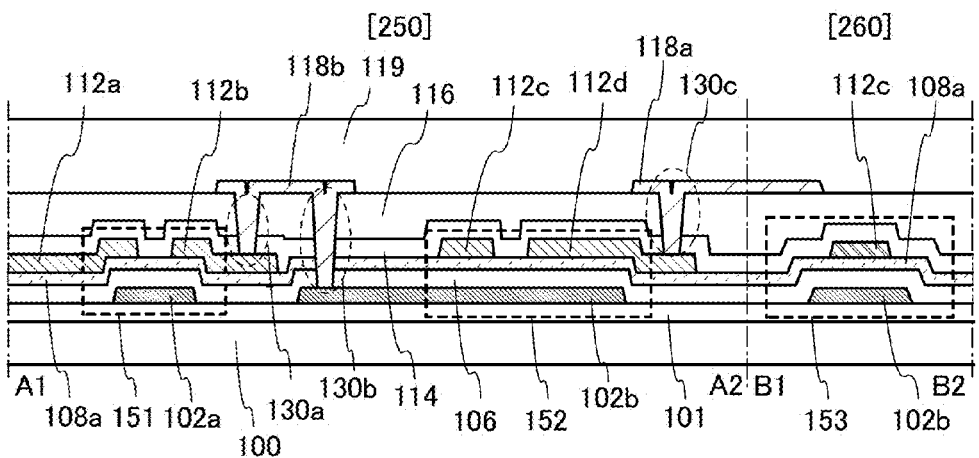

In addition, the shape of the semiconductor layer 108a illustrated in FIGS. 1A and 1B is only an example and one embodiment of the present invention is not limited thereto. For example, the semiconductor layer 108a may be left on the entire pixel region as illustrated in FIGS. 4A and 4B. The oxide semiconductor layer has high resistance as described above and has a light-transmitting property with respect to visible light. For these reason, even when light emitted from a light-emitting element is emitted to the transistor side, light can be transmitted. However, in the fifth opening 130e, the semiconductor layer 108a over the gate wiring (the first gate electrode layer 102a) has a separation region. Note that the semiconductor layer may be separated in each transistor.

In the second transistor 152 of this embodiment, the other of the second source electrode layer and the second drain electrode layer 112d is surrounded by the one of the second source electrode layer and the second drain electrode layer 112c having a U-shape (C-shaped, reversed C-shaped, or horseshoe-shaped). With such a shape, a sufficient channel width can be secured even when the area of the transistor is small; thus, the amount of current flowing during a conduction state of the transistor (also referred to as an on-state current) can be increased.

One embodiment of the present invention has such a feature that the number of photolithography steps can be reduced by successively etching the protective insulating layer 114 and a semiconductor film 108. Then, an example of the manufacturing method will be described in detail with reference to FIGS. 5A to 5C, FIGS. 6A to 6C, FIGS. 7A and 7B, and FIGS. 8A and 8B.

Note that a method for manufacturing a transistor portion 250 is mainly described here, and a method for manufacturing a capacitor portion 260, a wiring intersection portion 270, and an FPC connection portion 280, which are illustrated, will be described as necessary.

First, the base film 101 is formed over the substrate 100. The base film has a function of preventing diffusion of impurity elements from the substrate 100 and can be formed from a film selected from a silicon oxide film, a silicon oxynitride film, a silicon nitride film, a hafnium oxide film, an aluminum oxide film, a gallium oxide film, and a gallium aluminum oxide film. The structure of the base film is not limited to a single-layer structure, and may be a stacked-layer structure of a plurality of the above films. Note that as long as the substrate 100 is an insulator and does not contain the impurity elements which contaminate the semiconductor layer as explained above, the base film 101 can be omitted.

Here, a substrate having heat resistance enough to withstand at least heat treatment to be subsequently performed can be used as the substrate 100. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate made of silicon, silicon carbide, or the like; a compound semiconductor substrate made of silicon germanium or the like; an SOI substrate; a metal substrate such as a stainless steel film; a highly heat-resistance resin substrate such as a polyimide film; or the like can also be used as the substrate 100.

Next, a first conductive film is formed over the base film 101 and then the first gate electrode layer 102a and the second gate electrode layer 102b are formed through a first photolithography step and an etching step (see FIG. 5A).

Note that a resist mask used in a photolithography step may be formed by an ink jet method. Formation of the resist mask by an ink-jet method needs no photomask; thus, manufacturing cost can be further reduced. The resist mask is removed after etching, and description of this step in each photolithography step is omitted.

The first gate electrode layer 102a and the second gate electrode layer 102b can be formed using a metal material such as molybdenum, titanium, tantalum, tungsten, aluminum, copper, neodymium, or scandium, or an alloy material which includes any of these metal materials as its main component by a sputtering method or the like. The structure of the gate electrode layers is not limited to a single-layer structure, and may be a stacked-layer structure of a plurality of the above materials. For example, a stacked-layer structure of aluminum and molybdenum, a stacked-layer structure of aluminum and titanium, a stacked-layer structure of copper and molybdenum, a stacked-layer structure of copper and tungsten, and the like can be given. Here, a stacked-layer structure in which molybdenum is stacked over copper is used.

Next, the gate insulating layer 106 is formed over the first gate electrode layer 102a and the second gate electrode layer 102b by a CVD method, a sputtering method, or the like. The gate insulating layer 106 is preferably formed so as to contain silicon oxide, silicon nitride, silicon oxynitride, aluminum oxide, tantalum oxide, hafnium oxide, yttrium oxide, gallium oxide, lanthanum oxide, hafnium silicate (HfSi$_x$O$_y$ (x>0, y>0)), hafnium silicate (HfSiO$_x$N$_y$ (x>0, y>0)) to which nitrogen is added, hafnium aluminate (HfAlO$_x$N$_y$ (x>0, y>0)) to which nitrogen is added, or the like. Alternatively, the gate insulating layer 106 can be formed using a mixed material thereof by a plasma CVD method, a sputtering method, or the like. The structure of the gate insulating layer 106 is not limited to a single-layer structure, and may be a stacked-layer structure of a plurality of the above materials. The thickness of the gate insulating layer 106 is not particularly limited. For example, in the case where silicon oxide is used as the gate insulating layer 106, the thickness of the gate insulating layer 106 can be greater than or equal to 1 nm and less than or equal to 100 nm, preferably greater than or equal to 10 nm and less than or equal to 50 nm.

It is preferable that an insulating material containing the same kind of component as a semiconductor film to be subsequently formed be used for the gate insulating layer 106. Such a material enables the state of the interface with the semiconductor film to be kept favorably. Here, containing "a component which is the same as a component of the semiconductor film" means containing one or more of elements selected from constituent elements of the semiconductor film. For example, in the case where the semiconductor film is formed using an In—Ga—Zn-based oxide semiconductor material, gallium oxide or the like is given as such an insulating material containing the same kind of component as the semiconductor film.

For the formation of the gate insulating layer 106, a high-density plasma CVD method using microwaves (e.g., with a frequency of 2.45 GHz) is preferably employed because a high-quality insulating layer which is dense and has high breakdown voltage can be formed. The semiconductor layer is formed in close contact with the high-quality gate insulating layer, whereby the interface state density can be reduced.

Further, it is possible to use as the gate insulating layer an insulating layer whose quality and characteristics of the interface with the semiconductor layer are improved by heat treatment to be subsequently performed after the formation of the insulating layer. In any case, the gate insulating layer is preferably formed using an insulating layer that can reduce the interface state density with the semiconductor layer to form a favorable interface, as well as having favorable film quality.

In order that hydrogen, a hydroxyl group, and moisture are contained as little as possible in a semiconductor film (here an oxide semiconductor film) formed over the gate insulating layer 106, vacuum heating is preferably performed on the substrate 100 over which layers up to and including the gate insulating layer 106 are formed, in a preheating chamber of a deposition apparatus, so that impurities such as hydrogen and moisture adsorbed to the substrate 100 are eliminated and evacuated. As an evacuation unit provided for the preheating chamber, a cryopump is preferably used. Note that this preheating treatment can be omitted.

Next, the semiconductor film 108 having a thickness of greater than or equal to 2 nm and less than or equal to 200 nm, preferably greater than or equal to 5 nm and less than or equal to 30 nm is formed over the gate insulating layer 106 (see FIG. 5B).

An oxide semiconductor is preferably used for the semiconductor film 108. An oxide semiconductor to be used preferably contains at least indium (In) or zinc (Zn). In particular, In and Zn are preferably contained. As a stabilizer for reducing variation in electric characteristics of a transistor including the oxide semiconductor, it is preferable that gallium (Ga) be additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lathanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, or a zinc oxide, a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; a three-component metal oxide such as an In—Ga—Zn—O-based oxide (also referred to as IGZO), an In—Al—Zn—O-based oxide, an In—Sn—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; or a four-component metal oxide such as an In—Sn—Ga—Zn—O-based oxide, an In—Hf—Ga—Zn—O-based oxide, an In—Al—Ga—Zn—O-based oxide, an In—Sn—Al—Zn—O-based oxide, an In—Sn—Hf—Zn—O-based oxide, or an In—Hf—Al—Zn—O-based oxide can be used.

Note that here, for example, an "In—Ga—Zn—O-based oxide" means an oxide containing In, Ga, and Zn as its main component and there is no particular limitation on the ratio of In:Ga:Zn. The In—Ga—Zn—O-based oxide may contain a metal element other than the In, Ga, and Zn.

In particular, when an oxide semiconductor containing indium, an oxide semiconductor containing indium and gallium, or the like is used, a transistor having favorable electric characteristics can be formed. In this embodiment, a film including an In—Ga—Zn—O-based oxide is formed as the semiconductor film 108 by a sputtering method.

As the target used for a sputtering method, an oxide target having a composition ratio of $In_2O_3:Ga_2O_3:ZnO=1:1:1$ [molar ratio] is used. Alternatively, an oxide target having a composition ratio of $In_2O_3:Ga_2O_3:ZnO=1:1:2$ [molar ratio] may be used.

In the case where an In—Zn—O-based oxide is used as an oxide semiconductor, an oxide target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), or more preferably In:Zn=15:1 to 1.5:1 in an atomic ratio ($In_2O_3$:ZnO=15:2 to 3:4 in a molar ratio). For example, in an oxide target used for forming an In—Zn—O-based oxide semiconductor which has an atomic ratio of In:Zn:O=X:Y:Z, the relation of Z>1.5X+Y is satisfied.

Further, an In—Sn—Zn—O-based oxide can be referred to as ITZO. An oxide target which has a composition ration of In:Sn:Zn=1:2:2, 2:1:3, 1:1:1, 20:45:35, or the like in an atomic ratio is used as the target to be used.

The filling rate of the target is higher than or equal to 90% and lower than or equal to 100%, preferably higher than or equal to 95% and lower than or equal to 100%. With the use of the target with high filling rate, a dense oxide semiconductor film can be formed.

As the sputtering gas, a rare gas (typically argon), oxygen, or a mixed gas of a rare gas and oxygen can be used. It is preferable to use a high-purity gas from which impurities such as hydrogen, water, a hydroxyl group, or hydride are removed as the sputtering gas.

The oxide semiconductor film is preferably formed in the state where the substrate is heated. The substrate is held in a film formation chamber kept under reduced pressure, and a film is formed in the state where the substrate temperature is set to a temperature higher than or equal to 200° C. and lower than or equal to 450° C.; thus, the impurity concentration in the oxide semiconductor film can be reduced. Note that the maximum temperature varies depending on materials of the gate electrode layer. In the case where a stacked-layer structure of copper and molybdenum which have high melting points is used, as in this embodiment, or a stacked-layer structure of copper and tungsten is used, the maximum temperature can be set to 450° C. In the case where a stacked-layer structure including aluminum whose melting point is low is used, the maximum temperature is preferably set to 380° C.

In order to remove moisture remaining in the film formation chamber, an entrapment vacuum pump such as a cryopump, an ion pump, or a titanium sublimation pump is preferably used. As an evacuation unit, a turbo molecular pump to which a cold trap is added may be used. In the film formation chamber which is evacuated with a cryopump, for example, a hydrogen atom, a compound containing a hydrogen atom such as water, a compound containing a carbon atom, or the like are evacuated, whereby the impurity concentration in the oxide semiconductor film formed in the film formation chamber can be reduced.

As one example of the film formation condition, the following is given: the distance between the substrate and the target is 100 mm, the pressure is 0.6 Pa, the direct-current (DC) power is 0.5 kW, and the atmosphere is an oxygen atmosphere (the proportion of the oxygen flow rate is 100%). When a pulsed direct-current power source is used, powder substances (also referred to as particles or dust) that are generated in film formation can be reduced and the film thickness can be uniform.

Then, dehydration or dehydrogenation of the semiconductor film 108 is performed through first heat treatment. In this specification, the term "dehydration or dehydrogenation" refers to not only elimination of water or a hydrogen molecule but also elimination of a hydrogen atom, a hydroxyl group, or the like.

The heat treatment can be performed in such a manner that, for example, an object to be processed is introduced into an electric furnace in which a resistance heating element or the like is used and heated, under a nitrogen atmosphere at 450° C. for 1 hour. The semiconductor film 108 is not exposed to the air during the heat treatment so that entry of water and hydrogen can be prevented.

With this heat treatment, excessive hydrogen (including water and a hydroxyl group) can be removed, the structure of the oxide semiconductor film can be improved, and defect levels in an energy gap can be reduced. The first heat treatment is performed at a temperature higher than or equal to 250° C. and lower than or equal to 450° C. The duration of the heat treatment may be about 1 hour as long as the temperature is in the above favorable range. Note that the temperature and the duration of the heat treatment may be determined as appropriate by a practitioner; for example, the heat treatment may be performed at low temperature for a long time, or at high temperature for a short time. Note that the maximum temperature varies depending on materials of the gate electrode layer. As described above, in the case where a material including copper is used, the maximum temperature can be set to 450° C., whereas in the case where a material including aluminum is used, the maximum temperature is set to 380° C.

The heat treatment apparatus is not limited to the electric furnace and may be an apparatus for heating an object to be processed by thermal radiation or thermal conduction from a medium such as a heated gas. For example, an RTA (rapid thermal anneal) apparatus such as a GRTA (gas rapid thermal anneal) apparatus or an LRTA (lamp rapid they anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon, is used.

For example, as the first heat treatment, a GRTA process may be performed as follows. The object to be processed is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object to be processed. Note that the inert gas may be switched to a gas including oxygen during the process. This is because defect levels in energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into the heat treatment apparatus is greater than or equal to 6 N (99.9999%), preferably greater than or equal to 7 N (99.99999%) (that is, the impurity concentration is lower than or equal to 1 ppm, preferably lower than or equal to 0.1 ppm).

In any case, impurities are reduced by the first heat treatment so that an i-type (intrinsic) or substantially i-type oxide semiconductor film is obtained. Accordingly, a transistor having highly excellent characteristics can be realized.

Note that the above heat treatment is not limited to this timing; the heat treatment may be performed after the source electrode and the drain electrode are formed or after the protective insulating film is formed. Such treatment may be performed once or plural times.

Next, a second conductive film 112 to be source and drain electrode layers (including a wiring formed in the same layer as the source and drain electrode layers) is formed over the semiconductor film 108 (see FIG. 5C).

As the second conductive film 112, for example, a metal film containing an element selected from aluminum, chromium, copper, tantalum, titanium, molybdenum, and tungsten; a metal nitride film containing any of the above elements as its component (e.g., a titanium nitride film, a molybdenum nitride film, or a tungsten nitride film); or the like can be used. Alternatively, a structure may be used in which a film of a refractory metal such as titanium, molybdenum, or tungsten or a nitride film of any of them (e.g., a titanium nitride film, a molybdenum nitride film, or a tungsten nitride film) may be provided on one surface or both surfaces of a metal film such as an aluminum film or a copper film. For example, a stacked-layer structure of tungsten and copper, a stacked-layer structure of tungsten, tungsten nitride, copper, and tungsten, a stacked-layer structure of molybdenum, molybdenum nitride, copper, and molybdenum, a stacked-layer structure of molybdenum, aluminum, and molybdenum; and the like can be given. In this embodiment, a stacked-layer structure in which copper is stacked over tungsten is used.

Next, a resist mask is formed over the second conductive film 112 through a second photolithography step and selective etching is performed so that the one of the first source electrode layer and the first drain electrode layer 112a, the other of the first source electrode layer and the first drain electrode layer 112b, the one of the second source electrode layer and the second drain electrode layer 112c, and the other of the second source electrode layer and the second drain electrode layer 112d are formed. In addition, in the capacitor portion 260, the power source wiring (the one of the second source electrode layer and the second drain electrode layer 112c) is formed so as to overlap with the second gate electrode with the gate insulating layer 106 and the semiconductor film 108 interposed therebetween (see FIG. 6A).

Note that the etching of the second conductive film 112 is performed so that the semiconductor film 108 is not etched as much as possible. However, it is difficult to obtain etching conditions under which only the second conductive film 112 is etched. In some cases, the semiconductor film 108 is partly etched so as to have a groove portion (a recessed portion) by the etching of the second conductive film 112.

Through the above steps, the first transistor 151, the second transistor 152, and the capacitor 153 are formed. The transistor is a transistor including the semiconductor film 108 from which impurities such as hydrogen, moisture, a hydroxyl group, or hydride (also referred to as a hydrogen compound) are intentionally removed and which is highly purified.

Next, the protective insulating layer 114 is formed so as to cover the above components formed over the substrate 100 (see FIG. 6B). The protective insulating layer 114 can be formed with a thickness of at least 1 nm using, as appropriate, the above method by which impurities such as water and hydrogen are not mixed into the protective insulating layer 114 as much as possible. In this embodiment, the protective insulating layer 114 is formed by a sputtering method. When hydrogen is contained in the protective insulating layer 114, the hydrogen might enter the semiconductor film 108 or oxygen might be extracted from the semiconductor film 108 by the hydrogen. If such a phenomenon is caused, the resistance of the semiconductor film 108 on the backchannel side might be decreased (the semiconductor film 108 on the backchannel side might have n-type conductivity) and a parasitic channel might be formed. Therefore, it is important that the protective insulating layer 114 contain hydrogen as little as possible.

The protective insulating layer 114 may be formed to have a single-layer structure or a stacked-layer structure using a material including an inorganic insulating material such as silicon oxide, silicon oxynitride, silicon nitride, hafnium oxide, aluminum oxide, gallium oxide, or gallium aluminum oxide. The protective insulating layer 114 can be formed by a PVD method, a CVD method, or the like.

It is preferable that an insulating material containing the same kind of component as the semiconductor film 108 be used for the protective insulating layer 114 in a manner similar to that of the gate insulating layer 106. Such a material enables the state of the interface with the semiconductor film 108 to be kept favorably. For example, in the case where the semiconductor film 108 is formed using an In—Ga—Zn-based oxide semiconductor material, gallium oxide or the like is given as such an insulating material containing the same kind of component as the semiconductor film 108.

In the case where the protective insulating layer 114 has a stacked-layer structure, it is further preferable to employ a stacked-layer structure of an insulating film containing the same kind of component as the semiconductor film 108 (hereinafter referred to as a film a) and a film containing a material different from the component material of the film a (hereinafter referred to as a film b). The reason is as follows. When the protective insulating layer 114 has a structure such that the film a and the film b are sequentially stacked from the semiconductor film 108 side, charge is trapped preferentially in a charge trapping center at the interface between the film a and the film b (compared with the interface between the semiconductor film 108 and the film a). Thus, trapping of charge at the interface with the semiconductor film 108 can be sufficiently suppressed, resulting in high reliability of transistors using this structure.

For example, a stacked-layer structure in which a gallium oxide film and a silicon oxide film are stacked from the semiconductor film 108 side, or a stacked-layer structure in which a gallium oxide film and a silicon nitride film are stacked from the semiconductor film 108 side is preferably used as the protective insulating layer 114.

In this embodiment, a silicon oxide film is used for the protective insulating layer 114. The silicon oxide film can be formed by a sputtering method using a rare gas, oxygen, or a mixed gas of a rare gas and oxygen. The substrate temperature in film formation may be higher than or equal to room temperature and lower than or equal to 300° C. and, in this embodiment, is 100° C. Further, a silicon oxide target or a silicon target can be used as a target. For example, the silicon oxide film can be formed with the use of a silicon target and oxygen as a sputtering gas.

In order to remove moisture remaining in the film formation chamber in formation of the protective insulating layer 114 in a manner similar to that of the formation of the semiconductor film 108, an entrapment vacuum pump (such as a cryopump) is preferably used. In the film formation chamber which is evacuated with a cryopump, for example, a hydrogen atom, a compound containing a hydrogen atom such as water, a compound containing a carbon atom, or the like are evacuated, whereby the impurity concentration in the formed protective insulating layer 114 can be reduced. In addition, as an evacuation unit for removing moisture remaining in the film formation chamber, a turbo molecular pump to which a cold trap is added may be used.

It is preferable to use a high-purity gas from which impurities such as hydrogen, water, a hydroxyl group, or hydride are removed as the sputtering gas when the protective insulating layer 114 is formed.

Second heat treatment may be performed after the formation of the above protective insulating layer 114. The method and atmosphere of the heat treatment can be similar to those of the first heat treatment described above. The maximum temperature of the heat treatment varies depending on materials used for the gate electrode layer and the source and drain electrode layers, similar to the first heat treatment. In the case where the gate electrode layer and the source and drain electrode layers are formed using a metal having higher melting point such as copper, molybdenum, and tungsten, the maximum temperature can be set to 450° C. On the other hand, in the case where the gate electrode layer and the source and drain electrode layers are foimed using a metal having lower melting point such as aluminum, the maximum temperature can be set to 380° C. Furthermore, the heat treatment may be performed in the air at a temperature of higher than or equal to 100° C. and lower than or equal to 200° C. for longer than or equal to 1 hour and shorter than or equal to 30 hours. This heat treatment may be performed at a fixed temperature once. Alternatively, the following change in temperature may be performed plural times: the temperature is increased from room temperature to a temperature of higher than or equal to 100° C. and lower than or equal to 200° C. and then decreased to room temperature.

In the case where the heat treatment is performed in the state where the semiconductor film 108 is in contact with the protective insulating layer 114 containing oxygen, oxygen can be further supplied to the semiconductor film 108 from the protective insulating layer 114 containing oxygen.

Next, the planarization insulating layer 116 is formed over the protective insulating layer 114 (see FIG. 6C). The planarization insulating layer 116 is preferably formed using an organic resin such as acrylic, polyimide, or polyamide; or siloxane.

When a photosensitive resin is used as the resin, a photoresist is not necessary and a desired shape can be formed by light exposure, so that the process can be simplified. Further, the photosensitive resin which is cured to a desired shape by light exposure can be used as a resist mask.

In this embodiment, a photosensitive acrylic resin is used for the planarization insulating layer 116 and is processed into an opening by light exposure (a third photolithography step). After that, the photosensitive acrylic resin is used as a mask to etch the protective insulating layer 114 and the semiconductor film 108, whereby the first opening 130a which reaches the other of the first source electrode layer and the first drain electrode layer 112b, the second opening 130b which reaches the second gate electrode layer 102b, the third opening 130c which reaches the other of the second source electrode layer and the second drain electrode layer 112d, and the fourth opening 130d which reaches the base film 101 are formed. Further, the fifth opening 130e in which the semiconductor film 108 over the first gate electrode layer has a separation region in the vicinity of the wiring intersection portion 270, and a sixth opening 130f which reaches the first gate electrode layer in the FPC connection portion 280 are also formed (see FIG. 7A).

For the above etching step, wet etching, dry etching, or both of them may be employed. For example, a hydrofluoric acid-based solution may be used as an etchant used for the protective insulating layer 114 and the gate insulating layer 106. As an etchant used for wet etching of the semiconductor film 108 which is an oxide semiconductor, for example, a mixed solution of phosphoric acid, acetic acid, and nitric acid can be used. Alternatively, ITO-07N (produced by KANTO CHEMICAL CO., INC.) may be used. Further, a gas containing chlorine (a chlorine-based gas such as chlorine ($Cl_2$), boron trichloride ($BCl_3$), silicon tetrachloride ($SiCl_4$), or carbon tetrachloride ($CCl_4$)) can be employed as an etching gas used for the dry etching. As the dry etching method, a parallel plate RIE (reactive ion etching) method or an ICP (inductively coupled plasma) etching method can be used.

Here, by the formation of the fourth opening 130d, an unnecessary region in the semiconductor film 108 is removed and thus the semiconductor layer 108a is formed. Therefore, a step such as processing a semiconductor film into an island shape can be omitted. That is, the number of photolithography steps can be reduced.

Next, a third conductive film is formed so as to cover the above components formed over the substrate 100. In this embodiment, the first transistor 151 and the second transistor 152 are re-channel transistors using an oxide semiconductor for the semiconductor layer 108a. For the third conductive film to be the first pixel electrode layer 118a, a material serving as a cathode of the light-emitting element is preferably used. Specifically, as a cathode, a material with low work function, such as Ca, Al, CaF, MgAg, or AlLi, can be used. Note that a light-transmitting conductive film may be used for the third conductive film in order to control the direction of light emission. In this case, the above material serving as a cathode may be formed over the light-transmitting conductive film. In this case, the above material which serves as the cathode may be formed over the light-transmitting conductive film, and the film using the above material may be formed thin enough to transmit light in the case where light is emitted to the light-transmitting conductive film side. As the light-transmitting conductive film, for example, indium oxide containing tungsten oxide, indium zinc oxide containing tungsten oxide, indium oxide containing titanium oxide, indium tin oxide containing titanium oxide, indium tin oxide (also referred to as ITO), indium zinc oxide, and indium tin oxide to which silicon is added can be given. Alternatively, a material formed of 1 to 10 graphene sheets (corresponding to one layer of graphite) may be used.

Next, the first pixel electrode layer 118a and the connection electrode layer 118b are formed through a fourth photolithography step and an etching step. The first pixel electrode layer 118a is electrically connected to the other of the second source electrode layer and the second drain electrode layer 112d in the third opening 130c. The connection electrode layer 118b is electrically connected to the other of the first source electrode layer and the first drain electrode layer 112b in the first opening 130a and the second gate electrode layer 102b in the second opening 130b. Note that a conductive layer 118c may be formed using the third conductive film to suppress an increase in contact resistance with an FPC terminal.

Figure 7A:
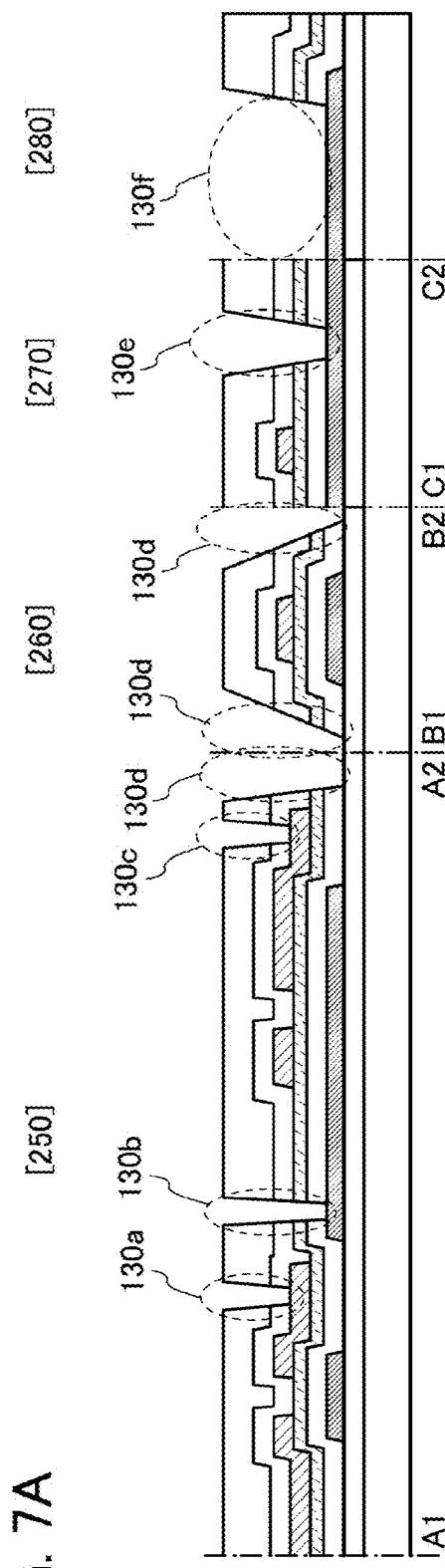
FIGS. 7A and 7B are cross-sectional views illustrating one embodiment of a method for manufacturing a light-emitting display device.
Figure 7B:
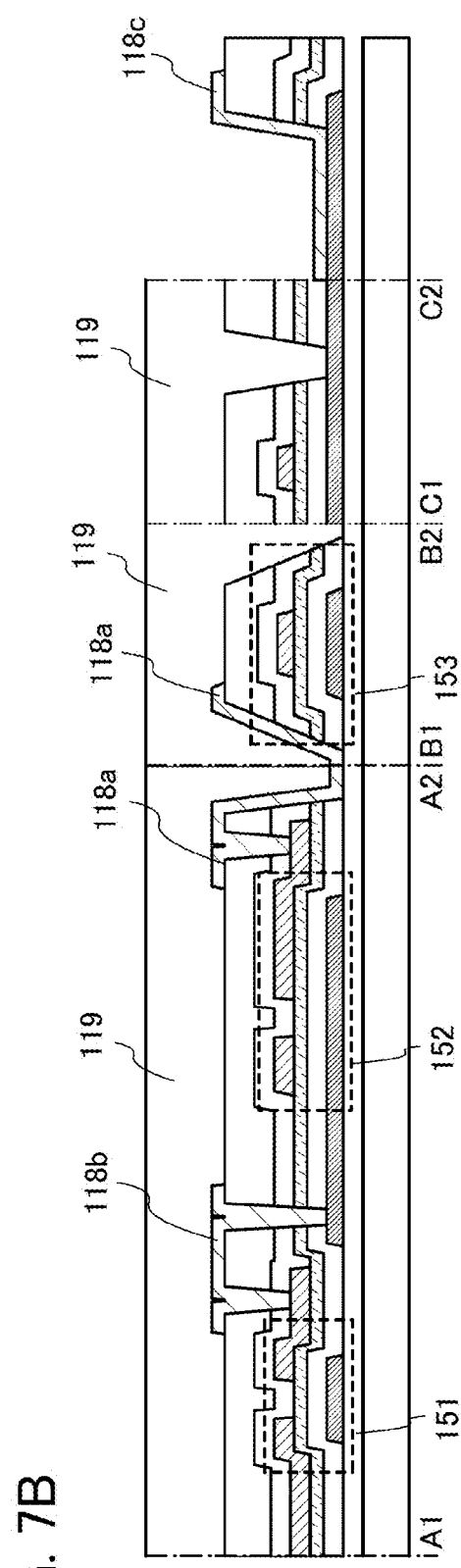

Next, the partition wall 119 is formed so as to cover a region including the transistor portion 250, the capacitor portion 260, the wiring intersection portion 270, and the first pixel electrode layer 118a (see FIG. 7B).

Next, the EL layer and the second pixel electrode layer are foimed over the first pixel electrode layer 118a, which is not illustrated.

Through the manufacturing method including the above steps, the light-emitting display device can be manufactured. In a structure in which the capacitor 153 is not formed, which is different from the structure in which the above method is employed, a structure in which the second gate electrode layer 102b in FIG. 4A is not formed in a region where the capacitor is formed may be employed.

Further, a structure without the planarization insulating layer 116 may be employed. In the manufacturing method of this structure, steps up to and including the step illustrated in FIG. 6A are performed in a manner similar to that of the above method. After these steps, a first opening 120a, a second opening 120b, a third opening 120c, a fourth opening 120d, a fifth opening 120e, and a sixth opening 120f are formed by a third photolithography step and an etching step (see FIG. 8A).

Then, a third conductive film is formed so as to cover the above components formed over the substrate 100, and a resist mask is formed over the third conductive film by a fourth photolithography step and is etched selectively, whereby the first pixel electrode layer 118a and the connection electrode layer 118b are formed.

Next, a partition wall 119 is formed so as to cover a region including the transistor portion 250, the capacitor portion 260, the wiring intersection portion 270, and the first pixel electrode layer 118a (see FIG. 8B).

Through the above, the step of forming the openings in the protective insulating layer 114 and the step of removing the unnecessary portions of the semiconductor film 108 are performed at the same time; therefore, a method for manufacturing a light-emitting display device in which the number of photolithography steps is reduced is provided.

Note that this embodiment can be freely combined with any of the other embodiments.

Embodiment 2

In this embodiment, another example of a structure of a pixel portion included in a light-emitting display device in one embodiment of the present invention, which is different from Embodiment 1, and a manufacturing method thereof will be described.

Figure 9A:
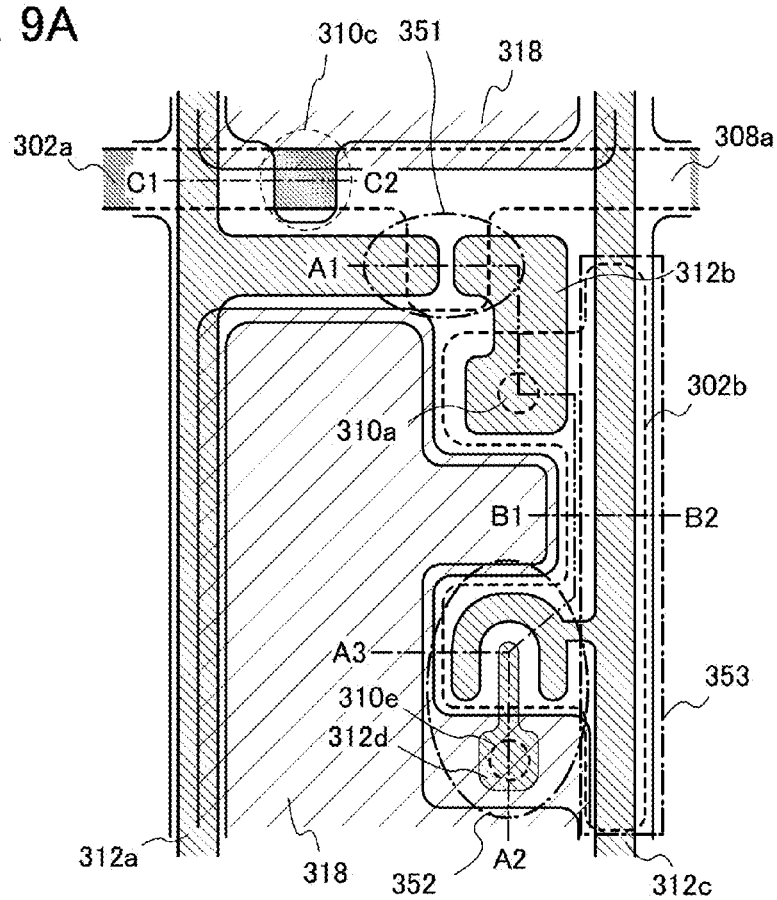
FIG. 9A is a plan view and FIG. 9B is a cross-sectional view illustrating one embodiment of a light-emitting display device.
Figure 9B:
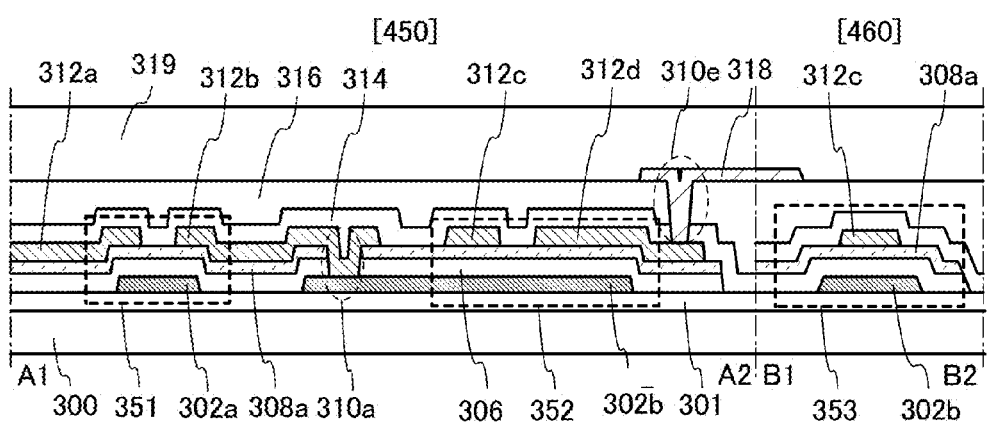

FIGS. 9A and 9B show an example of a pixel portion of an active matrix light-emitting display device to which one embodiment of the present invention is applied. FIG. 9A is a plan view of the pixel portion of the light-emitting display device, and FIG. 9B is a cross-sectional view taken along lines A1-A2 and B1-B2 of FIG. 9A. An equivalent circuit in the pixel portion similar to the pixel portion in Embodiment 1 is illustrated in FIG. 3A. Note that the EL layer 160 and the second pixel electrode layer (common electrode) 170 are not illustrated in FIGS. 9A and 9B.

In this embodiment, a structure of the pixel portion in the light-emitting display device and a manufacturing method thereof will be described. Note that a transistor in this embodiment refers to one or both of a first transistor 351 and a second transistor 352 illustrated in FIGS. 9A and 9B. These transistors are each an n-channel transistor including an oxide semiconductor to be described below.

The pixel portion of the active matrix light-emitting display device illustrated in FIGS. 9A and 9B includes, over a substrate 300 over which a base film 301 is formed, the first transistor 351 including a first gate electrode layer 302a, a gate insulating layer 306, a semiconductor layer 308a, one of a first source electrode layer and a first drain electrode layer 312a and the other of the first source electrode layer and the first drain electrode layer 312b; and the second transistor 352 including a second gate electrode layer 302b, the gate insulating layer 306, the semiconductor layer 308a, one of a second source electrode layer and a second drain electrode layer 312c and the other of the second source electrode layer and the second drain electrode layer 312d.

The first gate electrode layer 302a is connected to a gate wiring, the one of the first source electrode layer and the first drain electrode layer 312a is connected to a source or drain wiring, the other of the first source electrode layer and the first drain electrode layer 312b is connected to the second gate electrode layer 302b in a first opening 310a, the one of the second source electrode layer and the second drain electrode layer 312c is connected to a power supply wiring, and the other of the second source electrode layer and the second drain electrode layer 312d is connected to a first pixel electrode layer 318a in a fifth opening 310e. Note that in FIG. 9A, pairs of the gate wiring and the first gate electrode layer, the source or drain wiring and the one of the first source electrode layer and the first drain electrode layer, and the power supply wiring and the one of the second source electrode layer and the second drain electrode layer are respectively formed as one object and denoted by the same reference numerals.

Note that although the first transistor 351 illustrated in FIGS. 9A and 9B has a single-gate structure, a multi-gate structure may be employed. A multi-gate transistor has small off-current, and a light-emitting display device including the transistor can have improved display characteristics.

Further, the second gate electrode layer 302b and the power supply wiring (the one of the second source electrode layer and the second drain electrode layer 312c) have an overlapping region with the gate insulating layer 306 and the semiconductor layer 308a interposed therebetween, whereby a capacitor 353 is formed. When dielectric layers are formed to have a multi-layer structure in such a manner, even in the case where a pinhole is generated in one dielectric layer, the pinhole can be covered with another dielectric layer; therefore, the capacitor 353 can function normally. Further, the relative permittivity of an oxide semiconductor is as high as 14 to 16; therefore, the capacitance of the capacitor 353 can be increased when an oxide semiconductor is used for the semiconductor layer 308a.

A protective insulating layer 314 and a planarization insulating layer 316 are formed over the first transistor 351 and the second transistor 352, and the fifth opening 310e which reaches the other of the second source electrode layer and the second drain electrode layer 312d is formed by removing part thereof. Further, the planarization insulating layer 316 may be omitted.

Further, a third opening 310c illustrated in FIG. 9A is formed so as to form a separation region of the semiconductor layer 308a and the gate insulating layer 306 which are provided over the gate wiring (the first gate electrode layer 302a). With the third opening 310c, the adverse effect of a parasitic transistor including the gate wiring (the first gate electrode layer 302a), the gate insulating layer 306, the semiconductor layer 308a, the source or drain wiring (the one of the first source electrode layer and the first drain electrode layer 312a), and the power supply wiring (the one of the second source electrode layer and the second drain electrode layer 312c) can be eliminated.

Furthermore, a partition wall 319, which is not illustrated in FIG. 9A, is formed so as to cover the end portions of the first pixel electrode layer 318a, an unevenness region in the above structure, and the like. With the partition wall 319, disconnection of the EL layer and the second pixel electrode layer to be subsequently formed over the first pixel electrode layer 318a and the like can be prevented.

Note that a capacitor is not necessarily provided as illustrated in FIG. 10. In FIG. 10, the second gate electrode layer 302b does not overlap with the power supply wiring (the one of the second source electrode layer and the second drain electrode layer 312c); thus, a capacitor is not formed. An equivalent circuit of this structure is illustrated in FIG. 3B.

As a material for the semiconductor layer 308a, an oxide semiconductor is preferably used in a manner similar to that of Embodiment 1. Embodiment 1 can be referred to for the detail of the oxide semiconductor and the transistors.

Figure 11A:
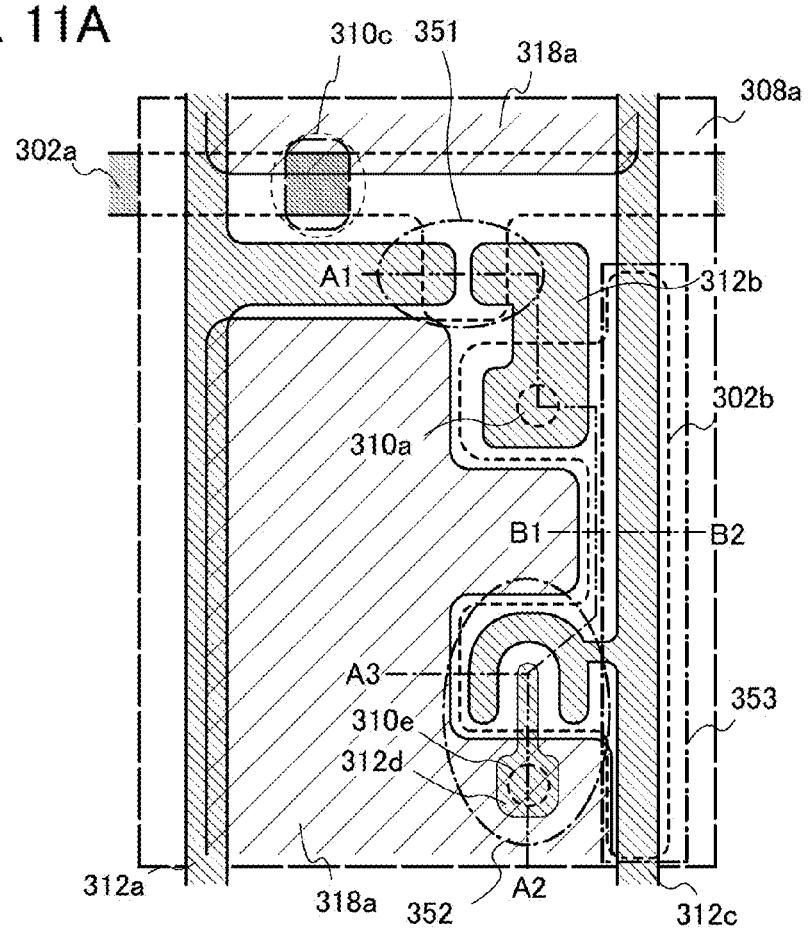
FIG. 11A is a plan view and FIG. 11B is a cross-sectional view illustrating one embodiment of a light-emitting display device.
Figure 11B:
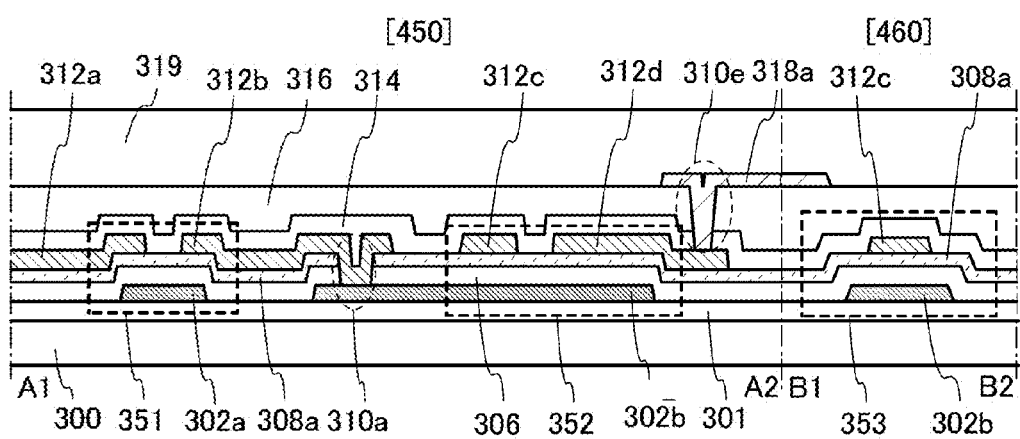

In addition, the shape of the semiconductor layer 308a illustrated in FIGS. 9A and 9B is only an example and one embodiment of the present invention is not limited thereto. For example, the semiconductor layer 308a may be left on the entire pixel region as illustrated in FIGS. 11A and 11B. The oxide semiconductor layer has high resistance as described above and has a light-transmitting property with respect to visible light. For these reasons, even when light emitted from a light-emitting element is emitted to the transistor side, light can be transmitted. However, in the third opening 310c, the semiconductor layer 308a over the gate wiring (the first gate electrode layer 302a) has a separation region. Note that the semiconductor layer may be separated in each transistor.

According to a feature of one embodiment of the present invention, the number of photolithography steps can be reduced by etching an unnecessary region in a semiconductor film 308 in a step of forming the first opening 310a. Next, an example of the manufacturing method will be described in detail with reference to FIGS. 12A to 12C, FIGS. 13A to 13C, FIGS. 14A and 14B, and FIGS. 15A and 15B.

Note that a method for manufacturing a transistor portion 450 is mainly described here, and a method for manufacturing a capacitor portion 460, a wiring intersection portion 470, and an FPC connection portion 480, which are illustrated, will be described as necessary.

Note that the components of the pixel portion of the light-emitting display device in this embodiment are the same as the components having the same name in Embodiment 1, and the manufacturing method thereof can be referred to. Therefore, in this embodiment, the details are omitted in the description. Note that the structures of the openings are different from those in Embodiment 1, which will be therefore described.

First, in accordance with the illustration of FIGS. 5A and 5B in Embodiment 1, over the substrate 300, the base film 301, the first gate electrode layer 302a, the second gate electrode layer 302b, the gate insulating layer 306, and the semiconductor film 308 are formed through a first photolithography step and an etching step; and first heat treatment is performed (see FIGS. 12A and 12B).

Next, the first opening 310a which reaches the second gate electrode layer 302b, a second opening 310b which reaches the base film 301, and the third opening 310c and a fourth opening 310d which reach the first gate electrode layer 302a are formed through a second photolithography step and an etching step. Here, the first opening 310a is used for subsequent connection between the other of the first source electrode layer and the second drain electrode layer 312b of the first transistor 351 and the second gate electrode layer 302b; and the second opening 310b is formed by removing an unnecessary region of the semiconductor film 308 to form the semiconductor layer 308a. Further, the third opening 310c is used not to form the parasitic transistor described above, and the fourth opening 310d which is formed in the FPC connection portion is an opening for exposing the first gate electrode layer 302a (see FIG. 12C).

Here, the step of forming the second opening 310b also serves as a step of processing the semiconductor film into an island shape; therefore, the number of photolithography steps can be reduced.

Next, a second conductive film 312 to be source and drain electrode layers (including a wiring formed in the same layer as the source and drain electrode layers) is formed so as to cover the above components formed over the substrate 300 (see FIG. 13A).

Next, a resist mask is formed over the second conductive film 312 through a third photolithography step and selective etching is performed so that the one of the first source electrode layer and the second drain electrode layer 312a, the other of the first source electrode layer and the second drain electrode layer 312b, the one of the second source electrode layer and the second drain electrode layer 312c, and the other of the second source electrode layer and the second drain electrode layer 312d are formed. In addition, in the capacitor portion, the power source wiring (the one of the second source electrode layer and the second drain electrode layer 312c) is formed so as to overlap with the second gate electrode with the gate insulating layer 306 and the semiconductor film 308 interposed therebetween. In the FPC connection portion, a conductive layer 312e which is electrically connected to the first gate electrode layer 302a is formed (see FIG. 13B).

Through the above steps, the first transistor 351, the second transistor 352, and the capacitor 353 are formed.

Next, the protective insulating layer 314 and the planarization insulating layer 316 are formed so as to cover the above components formed over the substrate 300 (see FIG. 13C). When a photosensitive resin is used as the planarization insulating layer 316, a photoresist is not necessary and a desired shape can be formed by light exposure, so that the process can be simplified. Further, the photosensitive resin which is cured to a desired shape by light exposure can be used as a resist mask.

In this embodiment, a photosensitive acrylic resin is used for the planarization insulating layer 316 and is processed into an opening by light exposure (a fourth photolithography step). After that, the photosensitive acrylic resin is used as a mask to etch the protective insulating layer 314 and the semiconductor film 308, whereby the fifth opening 310e which reaches the second gate electrode layer 312d is formed. In the FPC connection portion, a sixth opening 310f which reaches the conductive layer 312e is formed (see FIG. 14A).

Then, a third conductive film is formed so as to cover the fifth opening 310e, and a resist mask is formed over the third conductive film by a fifth photolithography step and is etched selectively, whereby the first pixel electrode layer 318a is formed. Note that when an oxide conductive layer including ITO or the like is used as the third conductive film, in the FPC connection portion, a conductive layer 318b which suppresses an increase in contact resistance between an FPC terminal and the underlying metal conductive layer due to oxidation of a surface of the metal conductive layer can be formed, whereby reliability of the semiconductor device can be improved.

Next, the partition wall 319 is formed so as to cover a region including the transistor portion 450, the capacitor portion 460, the wiring intersection portion 470, and the first pixel electrode layer 318a (see FIG. 14B).

Next, the EL layer and the second pixel electrode layer are formed over the first pixel electrode layer 318a, which is not illustrated.

Through the manufacturing method including the above steps, the light-emitting display device can be manufactured. In a structure in which the capacitor 353 is not formed, which is different from the structure in which the above method is employed, a structure in which the second gate electrode layer 302b in FIG. 12A is not formed in a region where the capacitor is formed may be employed.

Further, a structure without the planarization insulating layer 316 may be employed. In the manufacturing method of this structure, steps up to and including the step of forming the protective insulating layer 314, which is included in the description of FIG. 13C, are performed in a manner similar to that of the above method. Through a fourth photolithography step, a fifth opening 350a and a sixth opening 350b are formed (see FIG. 15A).

Then, a third conductive film is formed so as to cover the fifth opening 350a, and a resist mask is formed over the third conductive film by a fifth photolithography step and is etched selectively, whereby the first pixel electrode layer 318a is formed.

Next, the partition wall 319 is formed so as to cover a region including the transistor portion 450, the capacitor portion 460, the wiring intersection portion 470, and the first pixel electrode layer 318a (see FIG. 15B).

Through the above, a method for manufacturing the light-emitting display device in which the number of photolithography steps is reduced can be provided.

Note that this embodiment can be freely combined with any of the other embodiments.

Embodiment 3

Figure 16A:
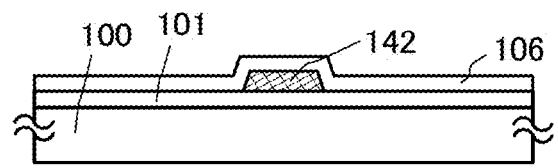
FIGS. 16A to 16C are cross-sectional views illustrating one embodiment of a method for manufacturing a light-emitting display device.
Figure 16B:
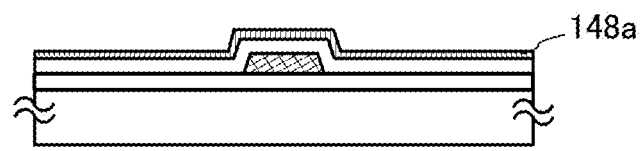
Figure 16C:
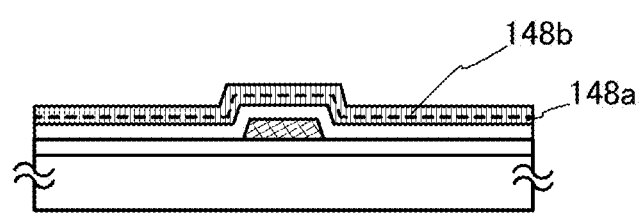

In this embodiment, an example of a process which is partly different from that described in Embodiment 1 and Embodiment 2 will be described with reference to FIGS. 16A to 16C. Note that for the description, although Embodiment 1 is to be referred to in this embodiment, Embodiment 2 may also be referred to. Further in part of FIGS. 16A to 16C, the same reference numerals are used for the same portions as those in FIGS. 5A to 5C in Embodiment 1, and description of the parts with the same reference numerals is omitted here.

First, in a manner similar to that of Embodiment 1, the base film 101 and the conductive film are formed over the substrate 100, and then the gate electrode layer 142 is formed through a first photolithography step and an etching step.

In this embodiment, a film formation temperature of a semiconductor film to be subsequently formed is higher than or equal to 200° C. and lower than or equal to 450° C. and a temperature of heat treatment after the formation of the semiconductor film is higher than or equal to 200° C. and lower than or equal to 450° C.; therefore, as materials of the gate electrode layer 142, a stacked-layer structure in which copper is used for a lower layer and molybdenum is used for an upper layer or a stacked-layer structure in which copper is used for a lower layer and tungsten is used for an upper layer is employed.

Next, in a manner similar to that of Embodiment 1, the gate insulating layer 106 is formed over the gate electrode layer 142 by a CVD method, a sputtering method, or the like. FIG. 16A is a cross-sectional view illustrating the structure obtained through the steps up to and including this step.

Next, a first oxide semiconductor film having a thickness of greater than or equal to 1 nm and less than or equal to 10 nm is formed over the gate insulating layer 106. In this embodiment, the first oxide semiconductor film having a thickness of 5 nm is formed under an oxygen atmosphere, an argon atmosphere, or an atmosphere including argon and oxygen under conditions where a target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed by setting an atmosphere where the substrate is placed to a nitrogen atmosphere or dry air. The temperature of the first heat treatment is higher than or equal to 200° C. and lower than or equal to 450° C. In addition, heating time of the first heat treatment is longer than or equal to 1 hour and shorter than or equal to 24 hours. By the first heat treatment, a first crystalline oxide semiconductor layer 148a is formed (see FIG. 16B).

Then, a second oxide semiconductor film having a thickness greater than 10 nm is formed over the first crystalline oxide semiconductor layer 148a. In this embodiment, the second oxide semiconductor film having a thickness of 25 nm is formed under an oxygen atmosphere, an argon atmosphere, or an atmosphere including argon and oxygen under conditions where a target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Next, second heat treatment is performed by setting an atmosphere where the substrate is placed to a nitrogen atmosphere or dry air. The temperature of the second heat treatment is higher than or equal to 200° C. and lower than or equal to 450° C. In addition, heating time of the second heat treatment is longer than or equal to 1 hour and shorter than or equal to 24 hours. By the second heat treatment, a second crystalline oxide semiconductor layer 148b is formed (see FIG. 16C).

In the subsequent steps, the second conductive film 112, the protective insulating layer 114, and the like are formed in accordance with Embodiment 1. The protective insulating layer 114, the first crystalline oxide semiconductor layer 148a, and the second crystalline oxide semiconductor layer 148b are etched with one resist mask so that the number of photolithography steps is reduced.

In this manner, the structure including the first transistor 151 and the second transistor 152 illustrated in FIGS. 1A and 1B can be obtained in accordance with Embodiment 1. Note that in the case where this embodiment is employed, the semiconductor layer including channel formation regions of such transistors has a stacked-layer structure of the first crystalline oxide semiconductor layer 148a and the second crystalline oxide semiconductor layer 148b. The first crystalline oxide semiconductor layer 148a and the second crystalline oxide semiconductor layer 148b are crystalline oxide semiconductors having c-axis alignment.

The crystalline oxide semiconductor is an oxide including a crystal with c-axis alignment (also referred to as C-Axis Aligned Crystal (CAAC)), which has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

Note that the CAAC is not limited to such a stacked-layer structure of the first crystalline oxide semiconductor layer 148a and the second crystalline oxide semiconductor layer 148b and can also have a single-layer structure.

Note that in order to form a CAAC, it is preferable that the planarity of the surface of a layer that serves as a base be improved as much as possible by CMP or the like and an average surface roughness thereof be made smaller than or equal to that of a thermal oxide film. The crystallinity and continuity of a crystal included in a CAAC can be improved by forming the CAAC over a layer having high surface planarity.

Further, it is preferable that the first oxide semiconductor film and the second crystalline oxide semiconductor film be formed using a sputtering gas in which the flow rate of oxygen is improved. For example, in the case where argon and oxygen are used as the sputtering gas, the crystallinity of a crystal included in a CAAC can be improved and an oxygen deficiency in the films can be compensated by setting the oxygen flow rate to higher than or equal to 30%. Further, when the film formation is performed at a temperature of higher than or equal to 150° C., the crystallinity of a crystal included in a CAAC can be further improved.

After each film is formed, the heat treatment is performed under a nitrogen atmosphere or under a reduced pressure. After that, heat treatment is performed under an oxygen atmosphere or a mixed atmosphere of nitrogen and oxygen, so that the CAAC can contain oxygen excessively and thus the oxygen deficiency can be compensated effectively. Note that the heat treatment is preferably performed at a temperature of approximately 450° C.

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 23A to 23E, FIGS. 24A to 24C, and FIGS. 25A to 25C. In FIGS. 23A to 23E, FIGS. 24A to 24C, and FIGS. 25A to 25C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 23A:
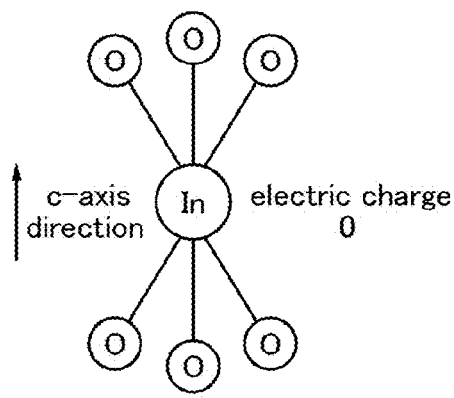
FIGS. 23A to 23E are diagrams illustrating structures of oxide materials.

FIG. 23A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 23A is actually an octahedral structure, but is illustrated as a planar structure for simplicity. Note that three tetracoordinate O atoms exist in each of an upper half and a lower half in FIG. 23A. In the small group illustrated in FIG. 23A, electric charge is O.

Figure 23D:
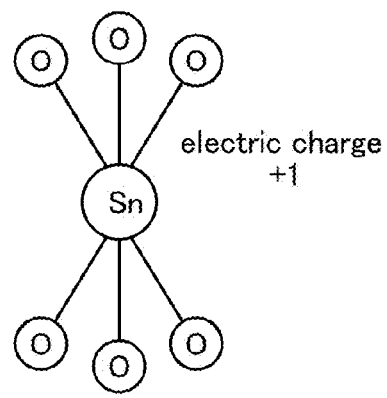
Figure 23B:
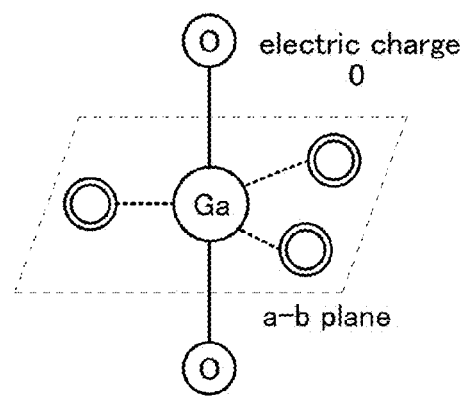

FIG. 23B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 23B. An Id atom can also have the structure illustrated in FIG. 23B because an In atom can have five ligands. In the small group illustrated in FIG. 23B, electric charge is 0.

Figure 23E:
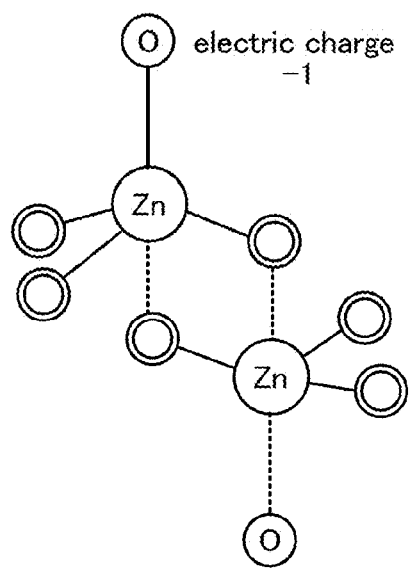
Figure 23C:
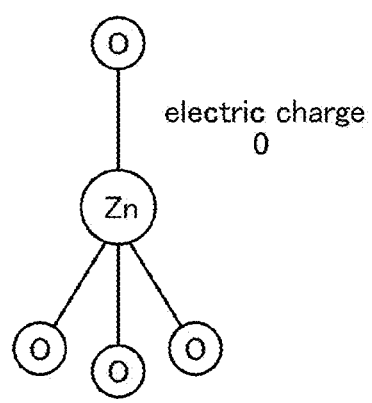

FIG. 23C illustrates a structure including one tetracoordinate Zn atom and four tetracoordinate O atoms proximate to the Zn atom. In FIG. 23C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 23C. In the small group illustrated in FIG. 23C, electric charge is O.

FIG. 23D illustrates a structure including one hexacoordinate Sn atom and six tetracoordinate O atoms proximate to the Sn atom. In FIG. 23D, three tetracoordinate O atoms exist in each of an upper half and a lower half In the small group illustrated in FIG. 23D, electric charge is +1.

FIG. 23E illustrates a small group including two Zn atoms. In FIG. 23E, one tetracoordinate O atom exists in each of an upper half and a lower half. In the small group illustrated in FIG. 23E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 23A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 24A:
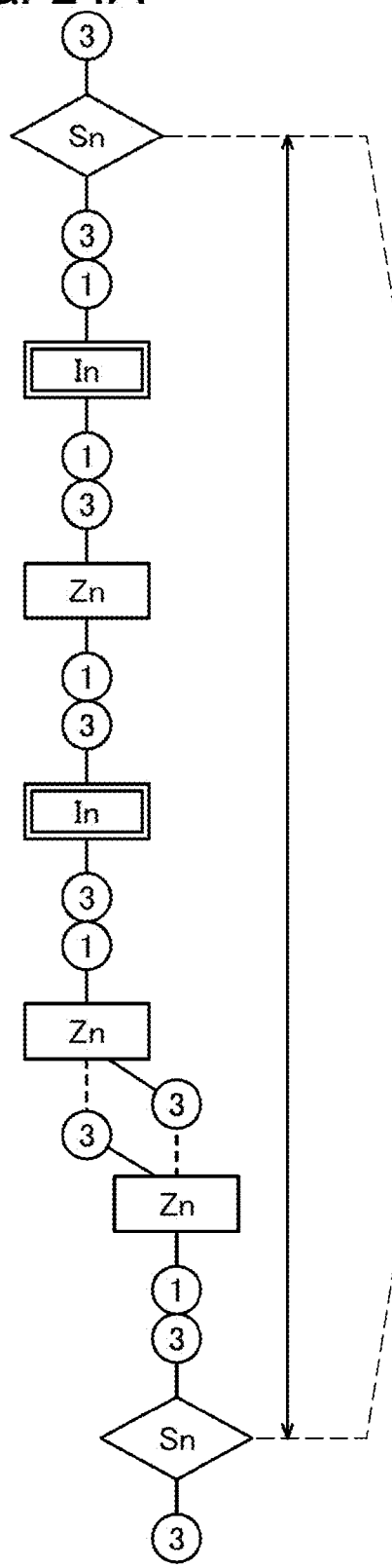
FIGS. 24A to 24C illustrate a structure of an oxide material.
Figure 24B:
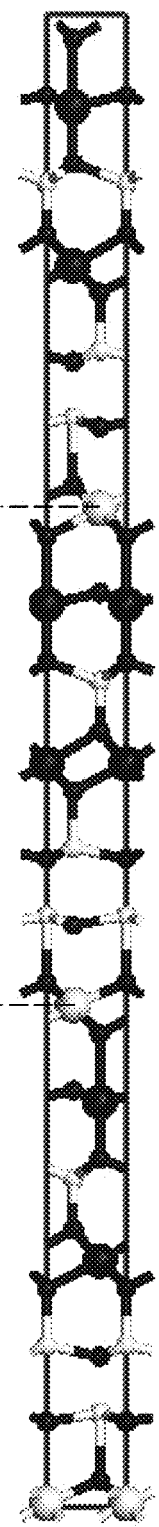
Figure 24C:

FIG. 24A illustrates a model of a medium group included in a layered structure of an In—Sn—Zn—O-based material. FIG. 24B illustrates a large group including three medium groups. Note that FIG. 24C illustrates an atomic arrangement in the case where the layered structure in FIG. 24B is observed from the c-axis direction.

In FIG. 24A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 24A, one tetracoordinate O atom existing in each of an upper half and a lower half with respect to an In atom is denoted by circled 1. FIG. 24A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 24A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels+1, is needed to form a layered structure including a Sn atom. As a structure having electric charge of −1, the small group including two Zn atoms as illustrated in FIG. 23E can be given. For example, with one small group including two Zn atoms, electric charge of one small group including a Sn atom can be cancelled, so that the total electric charge of the layered structure can be 0.

When the large group illustrated in FIG. 24B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn-0-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

For example, FIG. 25A illustrates a model of a medium group included in a layered structure of an In—Ga—Zn—O-based material.

In the medium group included in the layered structure of the In—Ga—Zn—O-based material in FIG. 25A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 25B illustrates a large group including three medium groups. Note that FIG. 25C illustrates an atomic arrangement in the case where the layered structure in FIG. 25B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 25A but also a medium group in which the arrangement of the In atom, the Ga atom, and the Zn atom is different from that in FIG. 25A.

When the large group illustrated in FIG. 25B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 26A:
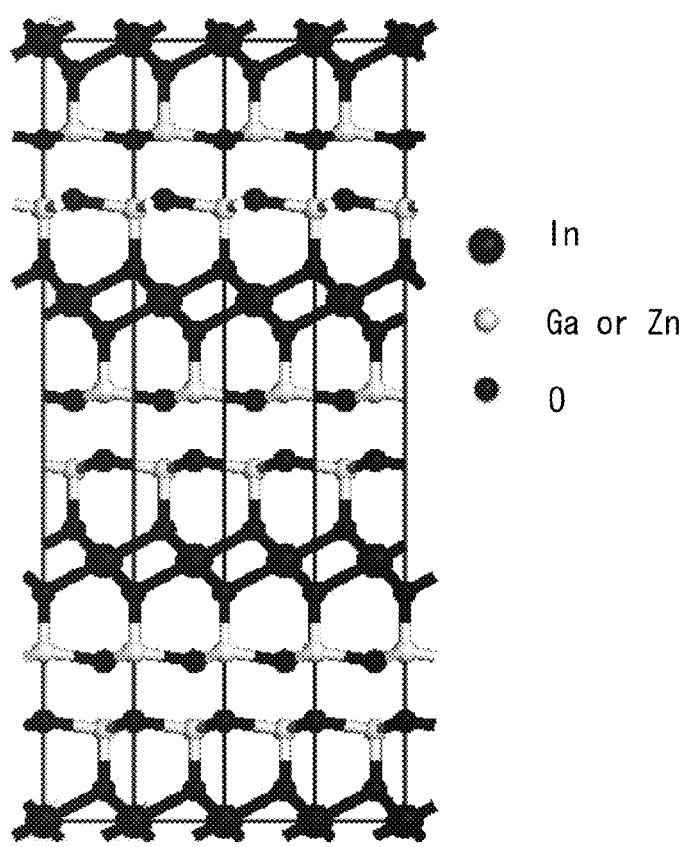
FIGS. 26A and 26B illustrate structures of oxide materials.

In the case where n=1 ($InGaZnO_4$), a crystal structure illustrated in FIG. 26A can be obtained, for example. Note that in the crystal structure in FIG. 26A, since a Ga atom and an In atom each have five ligands as illustrated in FIG. 23B, a structure in which Ga is replaced with In can be obtained.

Figure 26B:
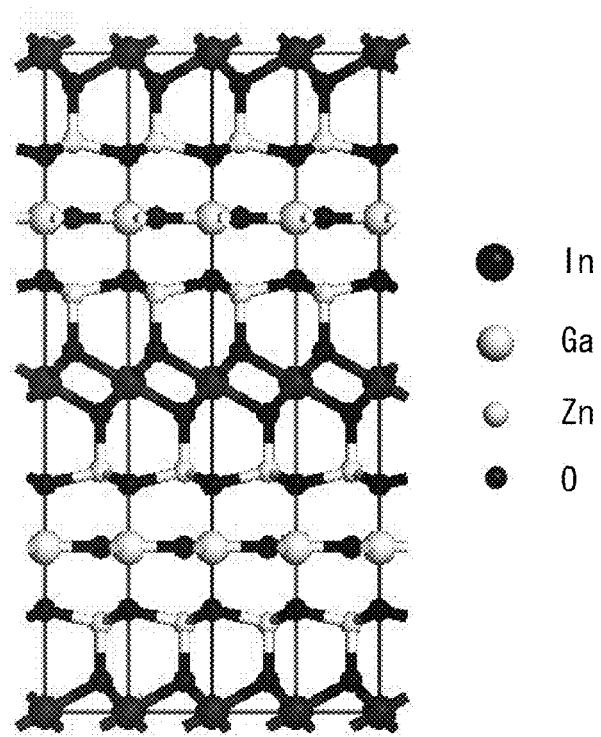

In the case where n=2 ($InGaZn_2O_5$), a crystal structure illustrated in FIG. 26B can be obtained, for example. Note that in the crystal structure in FIG. 26B, a Ga atom and an In atom each have five ligands as described in FIG. 23B, a structure in which Ga is replaced with In can be obtained.

With the use of the above CAAC for a transistor, the amount of shift of the threshold voltage of the transistor, which occurs by light irradiation and bias-temperature (BT) stress test, can be reduced.

Note that this embodiment can be freely combined with any of the other embodiments.

Embodiment 4

In this embodiment, an example of a light-emitting display device in one embodiment of the present invention will be described. As a display element included in the display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, so that current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

In the light-emitting display device which is described in this embodiment, the pixel portion has the structure described in Embodiment 1 or Embodiment 2, and the structure of Embodiment 1 is employed for the description for convenience. The light-emitting display device in this embodiment includes the substrate 100, the first transistor 151, the second transistor 152, the protective insulating layer 114, the planarization insulating layer 116, the partition wall 119, and the first pixel electrode layer 118a which is used for a light-emitting element (see FIGS. 1A and 1B). Further, an EL layer and a second pixel electrode layer are formed over the first pixel electrode layer 118a.

Since the first transistor 151 and the second transistor 152 for the pixel are n-channel transistors in this embodiment, a cathode is preferably used for the first pixel electrode layer 118a. Specifically, as a cathode, a material with low work function, such as Ca, Al, CaF, MgAg, or AlLi, can be used.

The partition wall 119 is formed using an organic resin film, an inorganic insulating film, or organic polysiloxane. It is particularly preferable that the partition wall 119 be formed using a photosensitive material; an opening be formed over the first pixel electrode layer 118a; and a side surface of the opening have an inclined surface with a continuous curvature.

Note that the EL layer may be formed using a single layer or a plurality of layers stacked.

The second electrode layer used as an anode is formed to cover the EL layer. The second pixel electrode layer can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon is added. Alternatively, a material formed of 1 to 10 graphene sheets (corresponding to one layer of graphite) may be used. The second pixel electrode layer may also be formed using a titanium nitride film or a titanium film instead of the above light-transmitting conductive film. The light-emitting element is formed by overlapping of the first pixel electrode layer 118a, the EL layer, and the second pixel electrode layer. After that, a protective film may be formed over the second pixel electrode layer and the partition wall 119 in order to prevent entry of oxygen, hydrogen, moisture, carbon dioxide, or the like into the light-emitting element. As the protective film, a silicon nitride film, a silicon nitride oxide film, a DLC film, or the like can be formed.

Furthermore, it is preferable that the display device be packaged (sealed) with a protective film (such as a laminate film or an ultraviolet curable resin film) or a cover material with high air-tightness and little degasification so that the display device is not exposed to the outside air.

Next, structures of the light-emitting element will be described with reference to FIGS. 17A to 17C. Note that FIGS. 17A to 17C are each a cross-sectional view in which the EL layer, the second pixel electrode layer, and the like are added to the cross-sectional structure taken along line A2-A3 of FIG. 1A.

In a light-emitting element, it is acceptable as long as at least one of an anode and a cathode has a light-transmitting property in order to extract light emission. A transistor and a light-emitting element are formed over a substrate. A light-emitting element can have a top emission structure, in which light emission is extracted through the surface on the side opposite to the substrate side; a bottom emission structure, in which light emission is extracted through the surface on the substrate side; or a dual emission structure, in which light emission is extracted through the surface on the side opposite to the substrate side and the surface on the substrate side. The pixel structure according to one embodiment of the present invention can be applied to a light-emitting element having any of these emission structures.

A light-emitting element having a top emission structure will be described with reference to FIG. 17A.

Figure 17A:
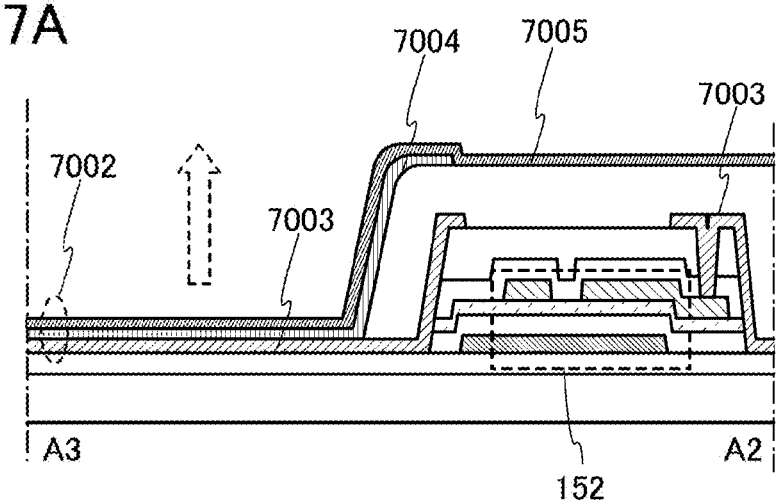
FIGS. 17A to 17C are cross-sectional views each illustrating a structure of a light-emitting element.
Figure 17B:
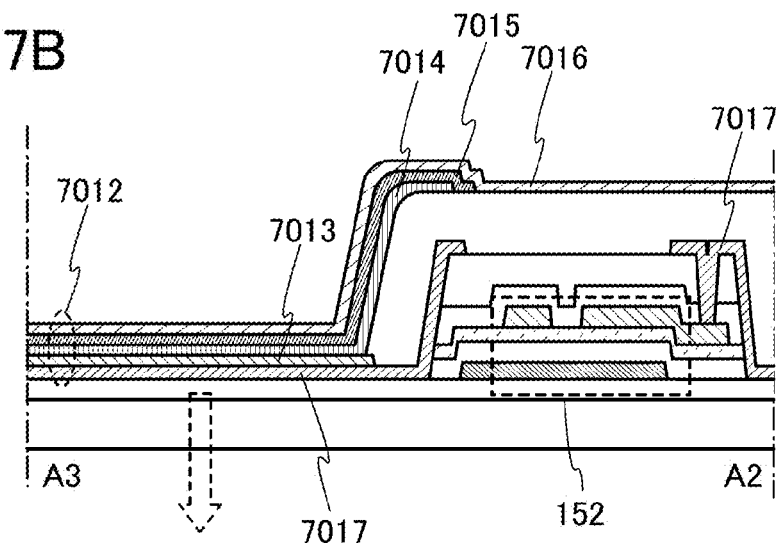
Figure 17C:
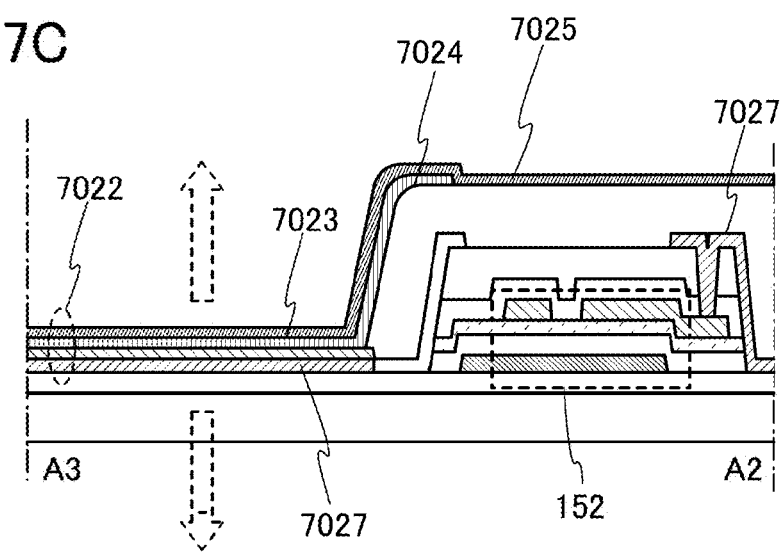

FIG. 17A is a cross-sectional view of a pixel in the case where the second transistor 152 is of an n-type transistor and light is emitted from a light-emitting element 7002 to an anode 7005 side. In FIG. 17A, a cathode 7003 of the light-emitting element 7002 is electrically connected to the second transistor 152, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in this order over the cathode 7003. It is not necessary to form all of these layers. The anode 7005 may be formed using a light-transmitting conductive material; for example, a light-transmitting conductive film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon is added, or the like may be used. Alternatively, a material formed of 1 to 10 graphene sheets (corresponding to one layer of graphite) may be used.

The light-emitting element 7002 corresponds to a region where the light-emitting layer 7004 is sandwiched between the cathode 7003 and the anode 7005. In the case of the pixel illustrated in FIG. 17A, light is emitted from the light-emitting element 7002 to the anode 7005 side as indicated by an arrow.

Next, a light-emitting element having a bottom emission structure will be described with reference to FIG. 17B. FIG. 17B is a cross-sectional view of a pixel in the case where the second transistor 152 is of an n-channel transistor and light is emitted from a light-emitting element 7012 to a cathode 7013 side. In FIG. 17B, the cathode 7013 of the light-emitting element 7012 is formed over a light-transmitting conductive film 7017 which is electrically connected to the second transistor 152, and a light-emitting layer 7014 and an anode 7015 are stacked in this order over the cathode 7013. A light-blocking film 7016 for reflecting or blocking light may be formed to cover the anode 7015 when the anode has a light-transmitting property. For the cathode 7013, various materials can be used as in the case of FIG. 17A as long as they are conductive materials having a low work function. Note that the thickness is set so that light is transmitted therethrough (preferably, a thickness of greater than or equal to 5 nm and less than or equal to 30 nm). For example, an aluminum film having a thickness of 20 nm can be used as the cathode 7013. The light-emitting layer 7014 may be formed using either a single layer or a plurality of layers stacked as in the case of FIG. 17A. The anode 7015 is not required to transmit light, but can be formed using a light-transmitting conductive material as in the case of FIG. 17A. As the light-blocking film 7016, a metal or the like that reflects light can be used for example; however, it is not limited to a metal film. For example, a resin to which black colorant is added can also be used.

The light-emitting element 7012 corresponds to a region where the light-emitting layer 7014 is sandwiched between the cathode 7013 and the anode 7015. In the case of the pixel illustrated in FIG. 17B, light is emitted from the light-emitting element 7012 to the cathode 7013 side as indicated by an arrow.

Next, a light-emitting element having a dual emission structure will be described with reference to FIG. 17C. In FIG. 17C, a cathode 7023 of a light-emitting element 7022 is formed over a light-transmitting conductive film 7027 which is electrically connected to the second transistor 152, and a light-emitting layer 7024 and an anode 7025 are stacked in this order over the cathode 7023. For the cathode 7023, various materials can be used as in the case of FIG. 17A as long as they are conductive materials having a low work function. Note that the thickness is set so that light is transmitted therethrough. For example, an aluminum film having a thickness of 20 nm can be used as the cathode 7023. The light-emitting layer 7024 may be formed using either a single layer or a plurality of layers stacked as in the case of FIG. 17A. The anode 7025 can be formed using a light-transmitting conductive material as in the case of FIG. 17A.

The light-emitting element 7022 corresponds to a region where the cathode 7023, the light-emitting layer 7024, and the anode 7025 overlap with one another. In the case of the pixel illustrated in FIG. 17C, light is emitted from the light-emitting element 7022 to both the anode 7025 side and the cathode 7023 side as indicated by arrows.

Note that although the organic EL elements are described here as the light-emitting elements, an inorganic EL element can also be provided as a light-emitting element.

Figure 18A:
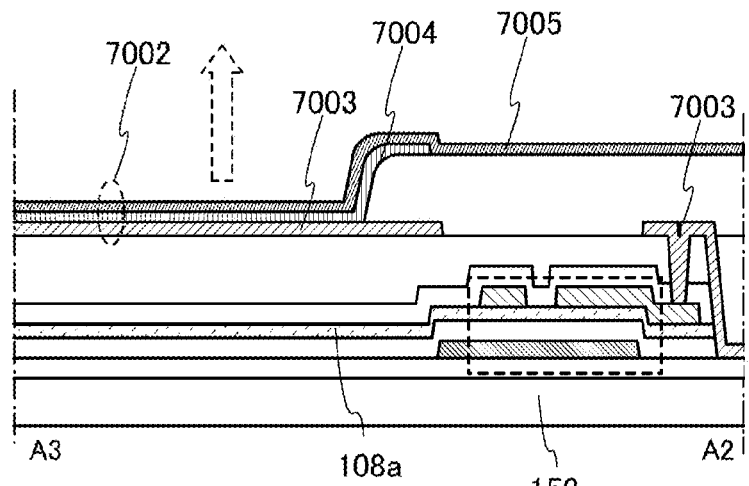
FIGS. 18A to 18C are cross-sectional views each illustrating a structure of a light-emitting element.
Figure 18B:
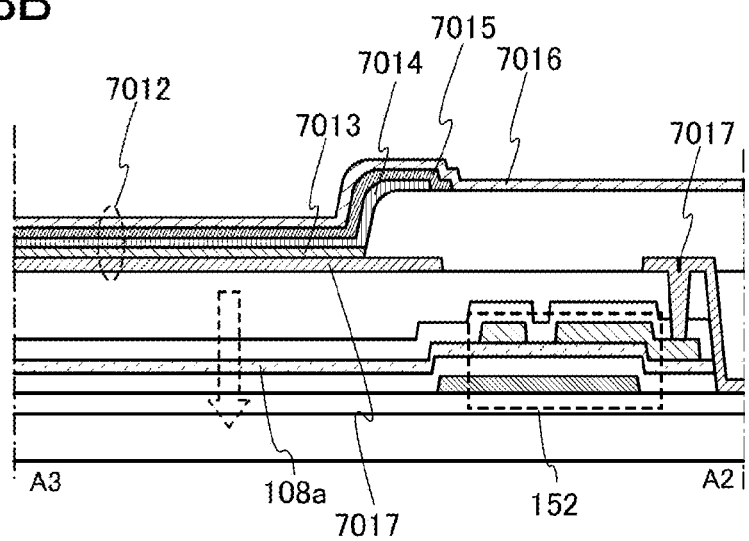
Figure 18C:
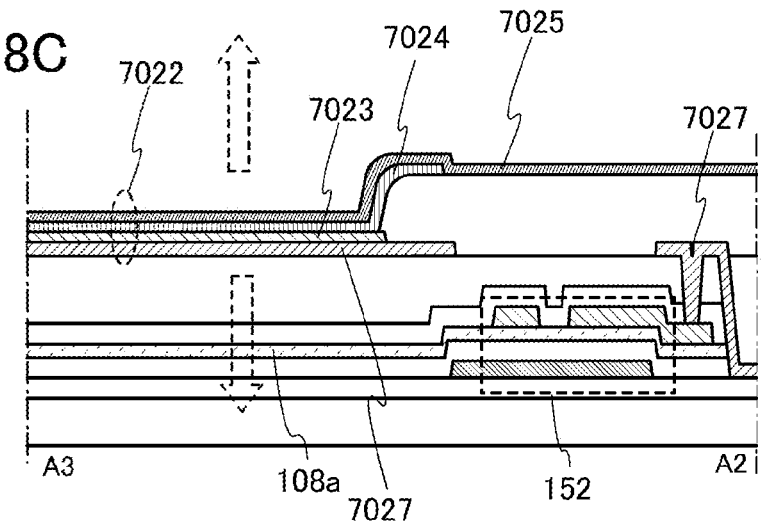

Further, even in a structure in which the semiconductor layer 108*a* is left in the entire pixel region illustrated in FIGS. 4A and 4B, which is described in Embodiment 1, light-emitting elements can have structures similar to those in FIGS. 17A to 17C. The structures of the light-emitting elements in this case are illustrated in FIGS. 18A to 18C. FIG. 18A is a top emission structure similar to FIG. 17A, FIG. 18B is a bottom emission structure similar to FIG. 17B, and FIG. 18C is a dual emission structure similar to FIG. 17C, and the detail descriptions for the above structures are the same as those of FIGS. 17A to 17C. Note that in the structures of FIGS. 18B and 18C, light can be transmitted in a bottom direction by using an oxide semiconductor layer, which has a light-transmitting property with respect to visible light, for the semiconductor layer 108*a*.

Note that the light-emitting display device described in this embodiment is not limited to the structures illustrated in FIGS. 17A to 17C or FIGS. 18A to 18C and can be modified in various ways based on the technical idea of the present invention.

Note that this embodiment can be freely combined with any of the other embodiments.

Embodiment 5

A light-emitting display device according to one embodiment of the present invention can be applied to a variety of electronic devices (including game machines). Examples of the electronic devices are a television set (also referred to as a television or a television receiver), a monitor of a computer or the like, a camera such as a digital camera or a digital video camera, a digital photo frame, a mobile phone set (also referred to as a mobile phone or a mobile phone device), a portable game machine, a portable information terminal, an audio reproducing device, and a large-sized game machine such as a pachinko machine.

Figure 19A:
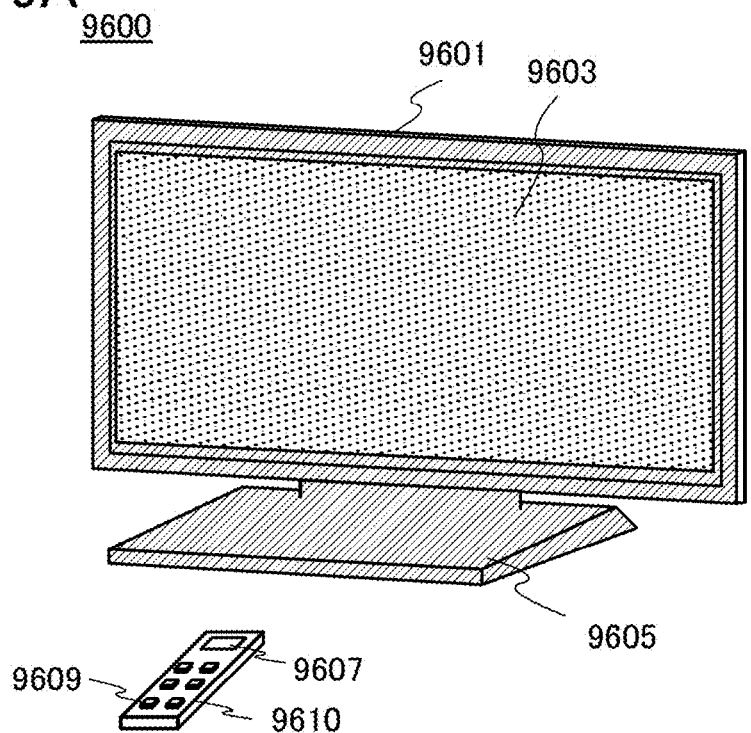
FIGS. 19A and 19B are diagrams each illustrating an electronic device.

FIG. 19A shows an example of a television set. In a television set 9600, a display portion 9603 is incorporated in a housing 9601. The display portion 9603 can display images. Here, the housing 9601 is supported by a stand 9605.

The television set 9600 can operate by an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Further, when the television set 9600 is connected to a communication network with or without wires via the modem, one-way (from a sender to a receiver) or two-way (between a sender and a receiver or between receivers) information communication can be performed.

Figure 19B:
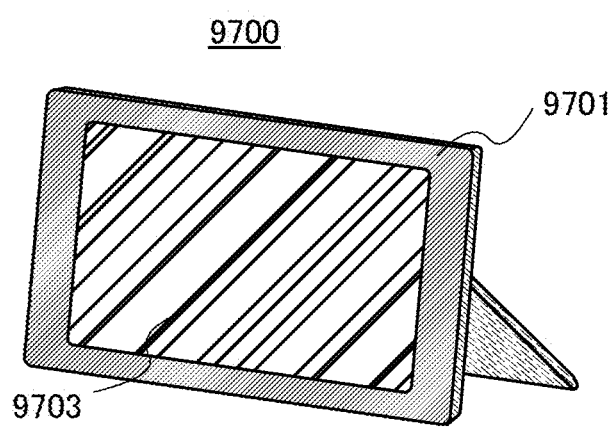

FIG. 19B shows an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may transmit and receive data wirelessly. The structure may be employed in which desired image data is transferred wirelessly to be displayed.

Figure 20A:
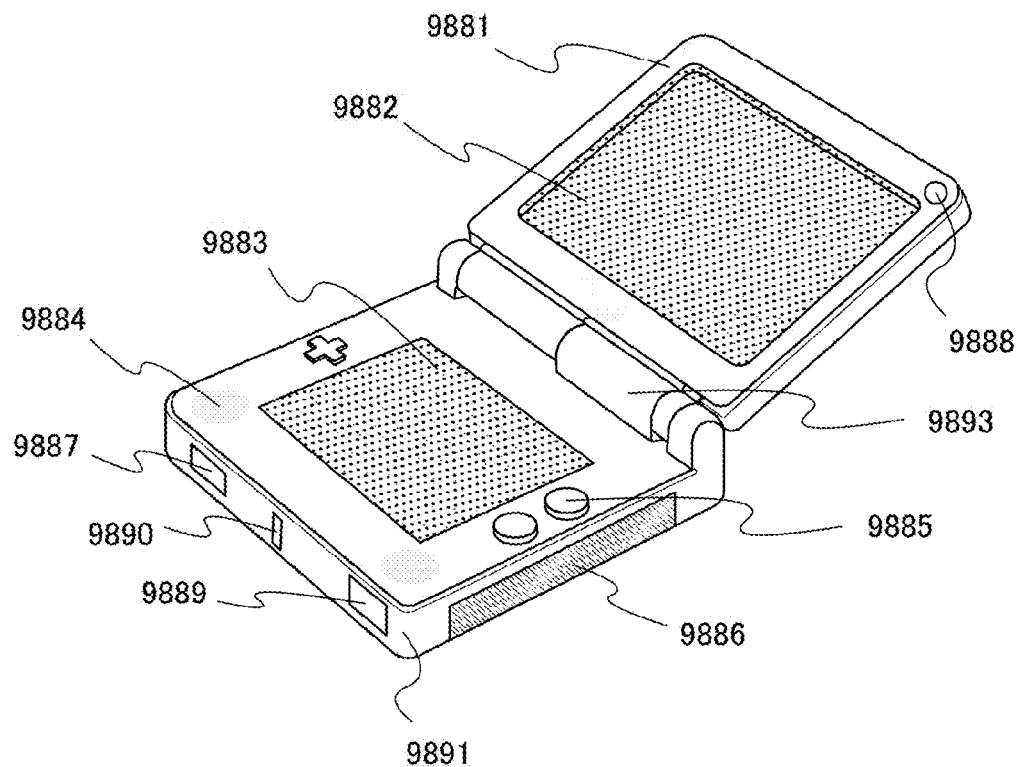
FIGS. 20A and 20B are diagrams each illustrating an electronic device.

FIG. 20A is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. The portable game machine illustrated in FIG. 20A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), and a microphone 9889), and the like. Needless to say, the structure of the portable game machine is not limited to the above, and another accessory may be provided as appropriate. The portable game machine illustrated in FIG. 20A has a function of reading out a program or data stored in a storage medium to display it on the display portion, and a function of sharing information with another portable game machine by wireless communication. Note that functions of the portable game machine illustrated in FIG. 20A are not limited to them, and the portable game machine can have various functions.

Figure 20B:
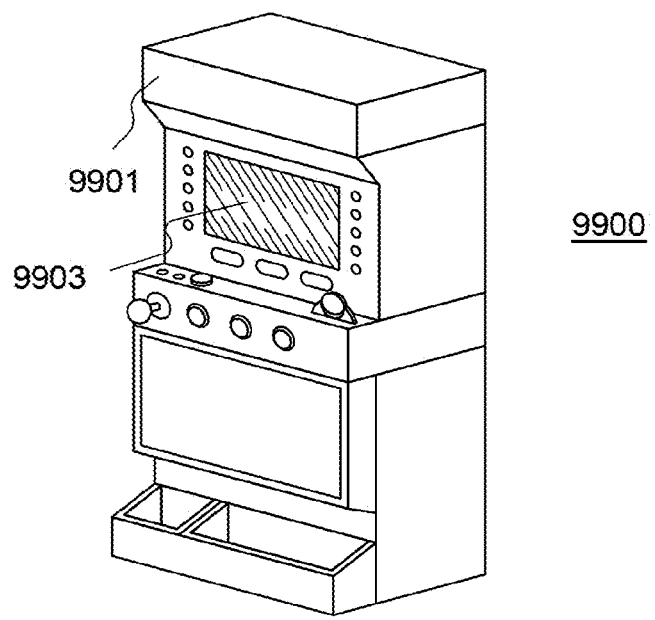

FIG. 20B shows an example of a slot machine which is a large-sized amusement machine. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above, and another accessory may be provided as appropriate.

Figure 21A:
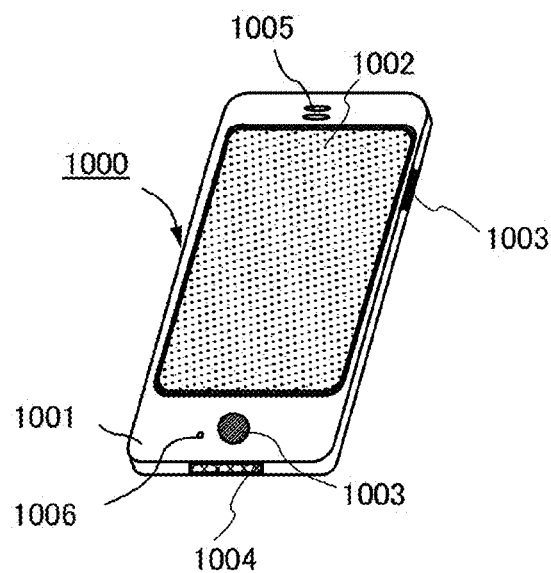
FIGS. 21A and 21B are diagrams each illustrating an electronic device.

FIG. 21A shows an example of a mobile phone set. A mobile phone set 1000 is provided with a display portion 1002 incorporated in a housing 1001, an operation button 1003, an external connection port 1004, a speaker 1005, a microphone 1006, and the like.

When the display portion 1002 of the mobile phone set 1000 illustrated in FIG. 21A is touched with a finger or the like, data can be input to the mobile phone set 1000. Users can make a call or send text by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case where a call or composing a mail is made, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone set 1000, display in the screen of the display portion 1002 can be automatically switched by determining the installation direction of the mobile phone set 1000 (whether the mobile phone set 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 21B:
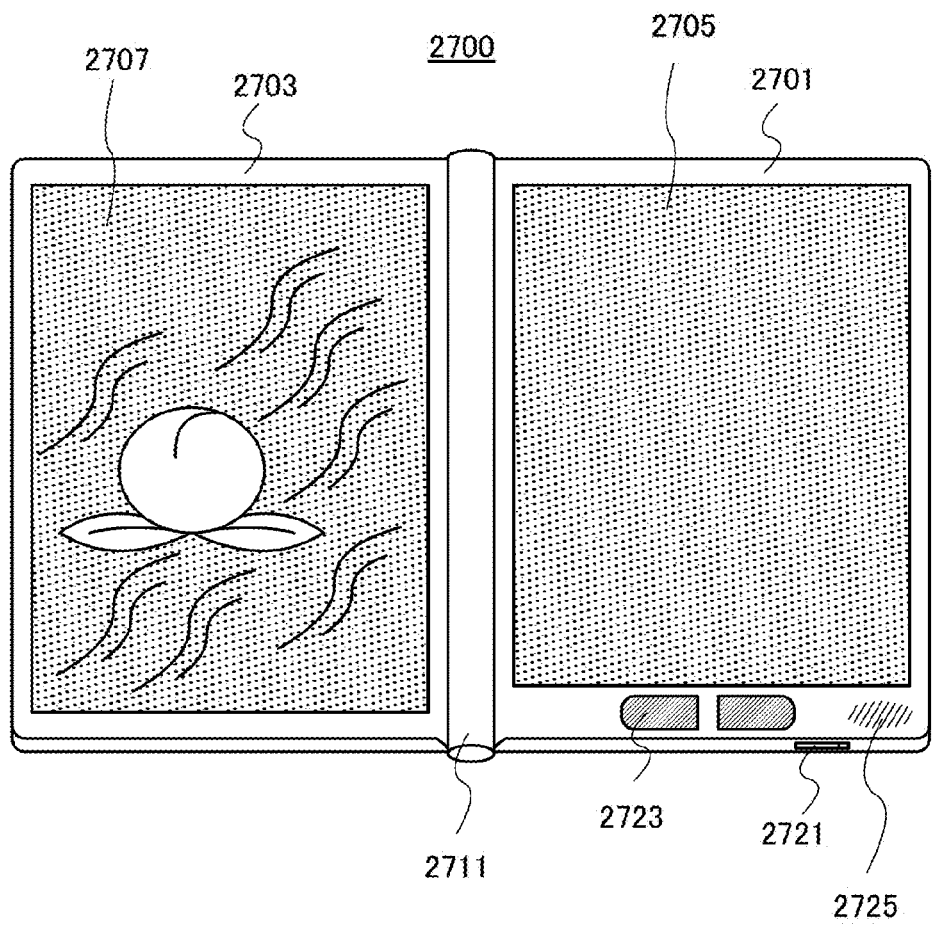

FIG. 21B shows an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 21B) and images can be displayed on a display portion on the left side (the display portion 2707 in FIG. 21B).

FIG. 21B shows an example in which the housing 2701 is provided with an operation portion and the like. For example, the housing 2701 is provided with a power switch 2721, operation keys 2723, a speaker 2725, and the like. With the operation key 2723, pages can be turned. Note that a keyboard, a pointing device, and the like may be provided on the same surface as the display portion of the housing. An external connection terminal (e.g., an earphone terminal, a USB terminal, or a terminal connectable to an AC adapter or a variety of cables such as a USB cable), a memory medium reading portion, or the like may be provided on the rear surface or the side surface of the housing 2701 and the housing 2703. Further, the e-book reader 2700 may have a function of an electronic dictionary.

The e-book reader 2700 may have a structure capable of wirelessly transmitting and receiving data. Through wireless communication, desired book data or the like can be purchased and downloaded from an electronic book server.

Note that this embodiment can be freely combined with any of the other embodiments.

Embodiment 6

In this embodiment, with the use of a light-emitting display device which switches an image for a left eye and an image for a right eye at high speed, an example in which a three-dimensional image which is a moving image or a still image is seen with dedicated glasses with which videos of the display device are synchronized will be described with reference to FIGS. 22A and 22B.

Figure 22A:
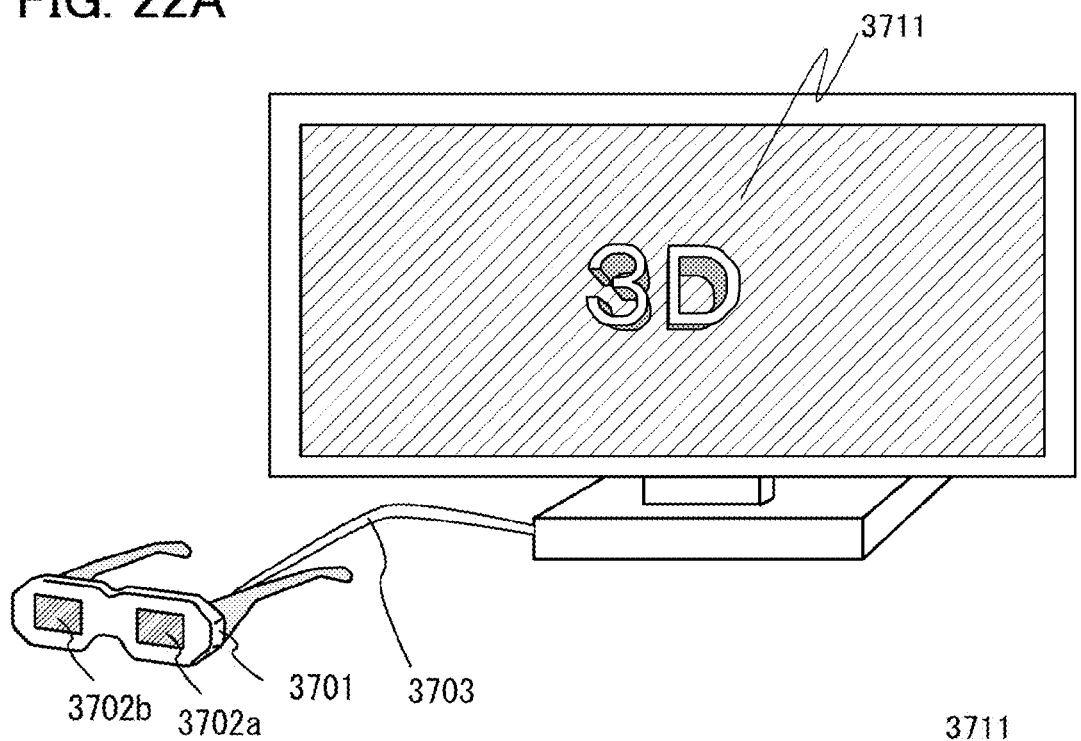
FIGS. 22A and 22B are diagrams illustrating an example of a device which shows a three-dimensional image which is a moving image or a still image with dedicated glasses with which an image of a display device is synchronized.

FIG. 22A is an external view in which a light-emitting display device 3711 and dedicated glasses 3701 are connected to each other with a cable 3703. In the dedicated glasses 3701, shutters provided in a panel 3702a for a left eye and a panel 3702b for a right eye are alternately opened and closed, whereby a user can see an image of the light-emitting display device 3711 as a three-dimensional image.

Figure 22B:
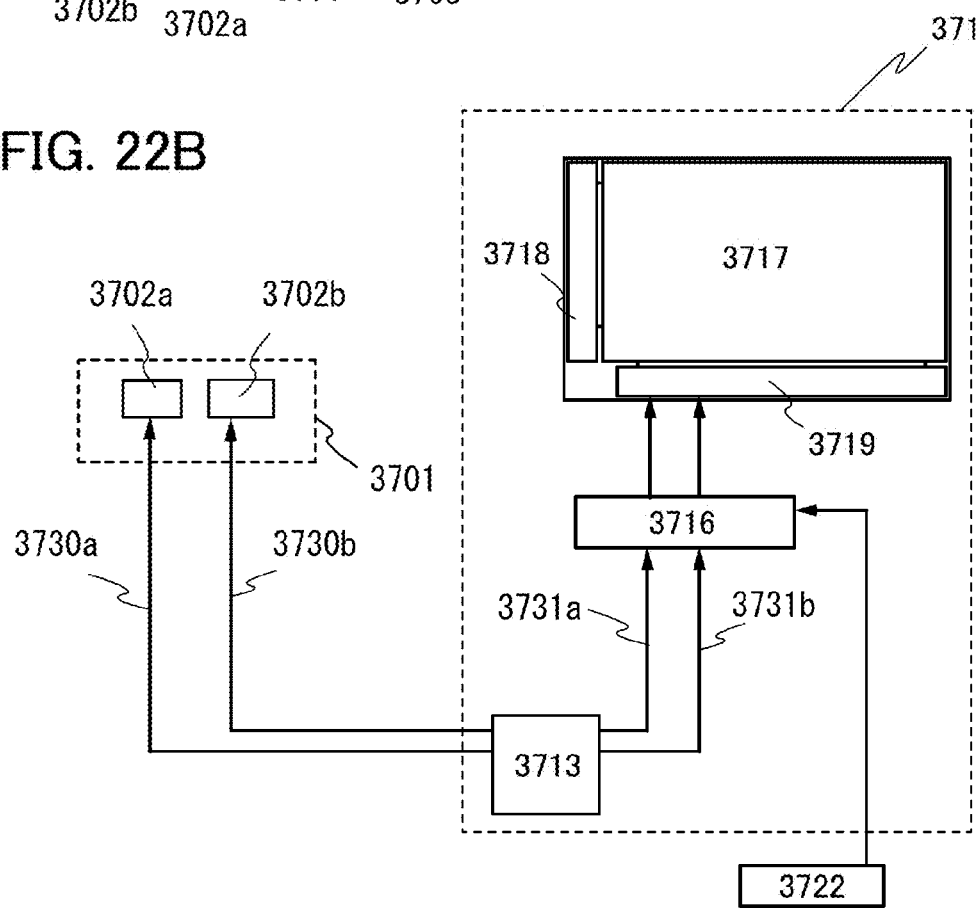

In addition, FIG. 22B is a block diagram illustrating a main structure of the light-emitting display device 3711 and the dedicated glasses 3701.

The light-emitting display device 3711 illustrated in FIG. 22B includes a display control circuit 3716, a display portion 3717, a timing generator 3713, a source line driver circuit 3718, an external operation unit 3722, and a gate line driver circuit 3719. Note that an output signal changes depending on operation by the external operation unit 3722 such as a keyboard.

In the timing generator 3713, a start pulse signal and the like are formed, and a signal for synchronizing an image for a left eye and the shutter of the panel 3702a for a left eye, a signal for synchronizing an image for a right eye and the shutter of the panel 3702b for a right eye, and the like are formed.

A synchronization signal 3731a of the image for a left eye is input to the display control circuit 3716, so that the image for a left eye is displayed on the display portion 3717. At the same time, a synchronization signal 3730a for opening the shutter of the panel 3702a for a left eye is input to the panel 3702a for a left eye. In addition, a synchronization signal 3731b of the image for a right eye is input to the display control circuit 3716, so that the image for a right eye is displayed on the display portion 3717. At the same time, a synchronization signal 3730b for opening the shutter of the panel 3702b for a right eye is input to the panel 3702b for a right eye.

Since an image for a left eye and an image for a right eye are switched at high speed, it is preferable to use a display panel which is driven with the frame frequency of, for example, 120 Hz or 240 Hz as the light-emitting display device 3711. Since the display panel is driven with the frame frequency of 120 Hz or 240 Hz, a light-emitting display panel using an organic μl element whose response speed is high is suitable for a display device which shows a three-dimensional image. Further, since the display panel is driven with the frame frequency of 120 Hz or 240 Hz, as the switching element, a transistor whose active layer is formed using an oxide semiconductor material having mobility higher than that of a transistor using amorphous silicon is appropriate.

Note that this embodiment can be freely combined with any of the other embodiments.

This application is based on Japanese Patent Application serial No. 2010-202823 filed with the Japan Patent Office on Sep. 10, 2010, the entire contents of which are hereby incorporated by reference.

What is claimed is:

1. A method for manufacturing a light-emitting display device comprising the steps of:
    forming a first conductive film over a substrate having an insulating surface;
    performing a first photolithography step on the first conductive film to form a first gate layer and a second gate layer;
    forming a first insulating film over the first gate layer and the second gate layer;
    forming a semiconductor film over the first insulating film;
    forming a second conductive film over the semiconductor film;
    performing a second lithography step on the second conductive film to form a first source layer and a first drain layer of a first transistor comprising the first gate layer, and a second source layer and a second drain layer of a second transistor comprising the second gate layer;
    forming a second insulating film over the first transistor, the second transistor, and the semiconductor film;
    performing a third lithography step, after formation of the second insulating film, to form:
        a first opening exposing part of one of the first source layer and the first drain layer and a second opening exposing part of one of the second source layer and the second drain layer by selectively etching the second insulating film; and
        a third opening exposing part of the second gate layer and a fourth opening exposing part of the substrate by selectively etching the second insulating film, the semiconductor film, and the first insulating film;
    forming a third conductive film over the second insulating film so as to cover the first opening, the second opening, the third opening, and the fourth opening; and
    performing a fourth lithography step on the third conductive film to form:
        a first pixel electrode electrically connected to the one of the second source layer and the second drain layer through the second opening; and
        a connection layer electrically connecting the one of the first source layer and the first drain layer to the second gate layer through the first opening and the third opening,
    wherein the first transistor and the second transistor comprise respectively a first region and a second region of the semiconductor layer; and
    wherein the semiconductor layer is continuously formed in the first region, in the second region, and along a path linking the first region and the second region.

2. A method for manufacturing a light-emitting display device according to claim 1,
    wherein the semiconductor layer is an oxide semiconductor layer, and
    further comprising a step of heating the semiconductor layer.

3. A method for manufacturing a light-emitting display device according to claim 1,
    further comprising formation of a fourth opening by the same steps as formation of the first opening and the second opening, the fourth opening exposing part of a wiring portion of the second gate layer to form a separation region in the semiconductor layer.

4. A method for manufacturing a light-emitting display device according to claim 1,
    wherein a capacitor is formed, capacitor in which a portion of the second gate layer, a third region of the semiconductor layer, and a portion of the other of the second source layer and the second drain layer overlapped with each other,
    wherein the semiconductor layer is continuously formed in the third region, and along a path linking the first region, the second region, and the third region.

5. A method for manufacturing a light-emitting display device according to claim 1, further comprising the step of:

forming a photosensitive planarization layer over the second insulating film before performing the third lithography step, wherein the photosensitive planarization layer is used as a mask for selectively etching the second insulating layer, the semiconductor layer, and the first insulating layer when forming the first opening, the second opening, the third opening, and the fourth opening.

6. A method for manufacturing a light-emitting display device according to claim 1, further comprising the step of:

forming a photosensitive planarization layer over the second insulating film before performing the fourth lithography step, wherein the photosensitive planarization layer is used as a mask for selectively etching the second insulating layer when forming the third opening.

7. A method for manufacturing a light-emitting display device according to claim 1, wherein the light-emitting display is applied to one of a television set, a monitor of a computer, a camera, a digital photo frame, a mobile phone set, a portable game machine, a portable information terminal, an audio reproducing device, and a large-sized game machine.

8. A method for manufacturing a light-emitting display device comprising the steps of:

forming a first conductive film over a substrate having an insulating surface;

performing a first photolithography step on the first conductive film to form a first gate layer and a second gate layer;

forming a first insulating film over the first gate layer and the second gate layer;

forming a semiconductor film over the first insulating film;

performing a second lithography step, after formation of the semiconductor film, to form a first opening exposing part of the second gate layer and a second opening exposing part of the substrate by selectively etching the semiconductor film and the first insulating film;

forming a second conductive film so as to cover the semiconductor film, the first opening, and the second opening;

performing a third lithography step on the second conductive film to form a first source layer and a first drain layer of a first transistor comprising the first gate layer, and a second source layer and a second drain layer of a second transistor comprising the second gate layer, one of the first source layer, and the second drain layer being electrically connected to the second gate layer through the first opening;

forming a second insulating film over the first transistor, the second transistor, and the semiconductor film;

performing a fourth lithography step, after formation of the second insulating film, to form a third opening exposing part of one of the second source layer and the second drain layer;

forming a third conductive film over the second insulating film so as to cover the third opening; and performing a fifth lithography step on the third conductive film to form a pixel electrode electrically connected to the one of the second source layer and the second drain layer through the third opening, wherein the first transistor and the second transistor comprise respectively a first region and a second region of the semiconductor layer; and wherein the semiconductor layer is continuously formed in the first region, in the second region, and along a path linking the first region and the second region.

9. A method for manufacturing a light-emitting display device according to claim 8, wherein the semiconductor layer is an oxide semiconductor layer, and further comprising a step of heating the semiconductor layer.

10. A method for manufacturing a light-emitting display device according to claim 8, further comprising formation of a fourth opening by the same steps as formation of the first opening and the second opening, the fourth opening exposing part of a wiring portion of the second gate layer to form a separation region in the semiconductor layer.

11. A method for manufacturing a light-emitting display device according to claim 8, wherein a capacitor is formed, capacitor in which a portion of the second gate layer, a third region of the semiconductor layer, and a portion of the other of the second source layer and the second drain layer overlapped with each other, wherein the semiconductor layer is continuously formed in the third region, and along a path linking the first region, the second region, and the third region.

12. A method for manufacturing a light-emitting display device according to claim 8, wherein the light-emitting display is applied to one of a television set, a monitor of a computer, a camera, a digital photo frame, a mobile phone set, a portable game machine, a portable information terminal, an audio reproducing device, and a large-sized game machine.

* * * * *